(12) United States Patent
Kim et al.

(10) Patent No.: US 8,159,071 B2
(45) Date of Patent: Apr. 17, 2012

(54) SEMICONDUCTOR PACKAGE WITH A METAL POST

(75) Inventors: Woon-Chun Kim, Suwon-si (KR); Soon-Gyu Yim, Seongnam-si (KR); Young-Do Kweon, Seoul (KR); Jae-Kwang Lee, Seongnam-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 292 days.

(21) Appl. No.: 12/405,776

(22) Filed: Mar. 17, 2009

(65) Prior Publication Data
US 2010/0096749 A1 Apr. 22, 2010

(30) Foreign Application Priority Data
Oct. 21, 2008 (KR) .................. 10-2008-0103181

(51) Int. Cl.
*H01L 23/48* (2006.01)
*H01L 23/52* (2006.01)
*H01L 29/40* (2006.01)
*H01L 23/053* (2006.01)
*H01L 23/12* (2006.01)

(52) U.S. Cl. ........ 257/774; 257/700; 257/737; 257/758; 257/E23.011; 257/E23.067; 257/E23.145

(58) Field of Classification Search .................. 257/774, 257/E23.011, E23.067, E23.145, 700, 737, 257/758
See application file for complete search history.

(56) References Cited

U.S. PATENT DOCUMENTS

| | | | |
|---|---|---|---|
| 5,397,917 A * | 3/1995 | Ommen et al. | 257/698 |
| 5,404,044 A * | 4/1995 | Booth et al. | 257/698 |
| 6,768,205 B2 * | 7/2004 | Taniguchi et al. | 257/774 |
| 6,790,684 B2 * | 9/2004 | Ahn et al. | 438/14 |
| 7,138,710 B2 * | 11/2006 | Fukazawa | 257/686 |
| 7,214,615 B2 * | 5/2007 | Miyazawa | 438/667 |
| 7,358,602 B2 * | 4/2008 | Hara | 257/689 |
| 7,385,283 B2 * | 6/2008 | Wu et al. | 257/686 |
| 7,547,957 B2 * | 6/2009 | Palanduz | 257/532 |
| 7,564,115 B2 * | 7/2009 | Chen et al. | 257/508 |
| 7,569,924 B2 * | 8/2009 | Fujii | 257/700 |

(Continued)

FOREIGN PATENT DOCUMENTS

JP 2000-277689 10/2000

(Continued)

OTHER PUBLICATIONS

Korean Office Action issued in Korean Patent Application No. KR 10-2008-0103181 dated Sep. 28, 2010.

(Continued)

*Primary Examiner* — Ida M Soward
(74) *Attorney, Agent, or Firm* — McDermott Will & Emery LLP

(57) ABSTRACT

Disclosed are a semiconductor package and a manufacturing method thereof. The semiconductor package can include a semiconductor substrate, having one surface on which a conductive pad is formed; an insulating layer, being formed on one surface of the semiconductor substrate; a metal post, penetrating through the conductive pad, the semiconductor substrate, and the insulating layer; and an outer-layer circuit, being electrically connected to the metal post. With the present invention, it can become unnecessary to form an additional via for electrically connecting both surfaces of the semiconductor substrate, thereby simplifying the manufacturing process, reducing the manufacturing cost, and improving the coupling reliability.

1 Claim, 66 Drawing Sheets

U.S. PATENT DOCUMENTS

| | | | | |
|---|---|---|---|---|
| 7,602,062 B1* | 10/2009 | Wang | | 257/738 |
| 7,613,007 B2* | 11/2009 | Amey et al. | | 361/763 |
| 7,622,810 B2* | 11/2009 | Takao | | 257/774 |
| 7,629,249 B2* | 12/2009 | Borthakur | | 438/637 |
| 7,683,458 B2* | 3/2010 | Akram et al. | | 257/621 |
| 7,701,052 B2* | 4/2010 | Borland et al. | | 257/700 |
| 7,713,872 B2* | 5/2010 | Morimoto | | 438/667 |
| 7,745,939 B2* | 6/2010 | Sunohara et al. | | 257/774 |
| 7,772,115 B2* | 8/2010 | Hiatt | | 438/667 |
| 7,804,177 B2* | 9/2010 | Lu et al. | | 257/778 |
| 7,902,643 B2* | 3/2011 | Tuttle | | 257/659 |
| 7,902,674 B2* | 3/2011 | Chang et al. | | 257/777 |
| 7,948,092 B2* | 5/2011 | Murayama et al. | | 257/783 |
| 8,022,314 B2* | 9/2011 | Kawamura et al. | | 174/262 |
| 8,022,513 B2* | 9/2011 | Hsu | | 257/668 |
| 2004/0201095 A1* | 10/2004 | Palmer et al. | | 257/700 |
| 2005/0017338 A1* | 1/2005 | Fukazawa | | 257/686 |
| 2007/0023888 A1* | 2/2007 | Fujii | | 257/698 |
| 2007/0044999 A1* | 3/2007 | Shibata et al. | | 174/262 |
| 2007/0090511 A1* | 4/2007 | Borland et al. | | 257/691 |
| 2008/0116566 A1* | 5/2008 | Murayama et al. | | 257/700 |
| 2008/0164574 A1* | 7/2008 | Savastiouk et al. | | 257/621 |
| 2009/0127667 A1* | 5/2009 | Iwata | | 257/621 |
| 2009/0278237 A1* | 11/2009 | Cooney et al. | | 257/621 |
| 2009/0283872 A1* | 11/2009 | Lin et al. | | 257/621 |
| 2009/0315154 A1* | 12/2009 | Kirby et al. | | 257/621 |
| 2011/0089539 A1* | 4/2011 | Akram et al. | | 257/620 |

FOREIGN PATENT DOCUMENTS

| | | |
|---|---|---|
| JP | 2006-49557 | 2/2006 |
| KR | 10-0679573 | 7/2007 |
| WO | WO 2005/093827 | 10/2005 |

OTHER PUBLICATIONS

Japanese Office Action, w/ English translation thereof, issued in Japanese Patent Application No. 2009-089606, dated Jun. 28, 2011.

* cited by examiner

SEMICONDUCTOR PACKAGE WITH A METAL POST

CROSS-REFERENCE TO RELATED APPLICATIONS

This application claims the benefit of Korean Patent Application No. 10-2008-0103181, filed with the Korean Intellectual Property Office on Oct. 22, 2008, the disclosure of which is incorporated herein by reference in its entirety.

BACKGROUND

1. Technical Field

The present invention relates to a semiconductor package and a manufacturing method thereof.

2. Description of the Related Art

A semi conductor package is manufactured by forming a metal post and an insulating layer on a semiconductor substrate, of which one surface is formed with an electrode, like a wafer level package (WLP) and a chip scale package (CSP).

In such semiconductor package, an outer-layer circuit is formed on the metal post, and a solder is formed on the outer-layer circuit, in order to make an electrical connection with an external device such as a main board.

In such conventional art, a via is formed to penetrate through the semiconductor substrate in order to utilize both surfaces of the semiconductor substrate. The via, however, is formed by a separate process from the metal post and then is coupled to the metal post, thereby lowering the reliability of the coupling between the metal post and the via, adding the manufacturing processes and increasing the manufacturing cost.

SUMMARY

The present invention provides a semiconductor substrate and a manufacturing method thereof that are not required to form a separate via so as to simplify the manufacturing process, reduce the manufacturing cost, and improve the coupling reliability.

An aspect of present invention features a semiconductor package, including a semiconductor substrate, of which one surface is formed with a conductive pad; an insulating layer, being formed on one surface of the semiconductor substrate; a metal post, penetrating through the conductive pad, the semiconductor substrate and the insulating layer; and an outer-layer circuit, being electrically connected to the metal post.

At this time, the method can further include a solder bump, being formed on the outer-layer circuit.

An aspect of present invention features a method of manufacturing a semiconductor package, including providing a semiconductor substrate, of which one surface is formed with a conductive pad; forming a hole on one surface of the semiconductor substrate such that the hole penetrates through the conductive pad; forming an insulating layer on one surface of the semiconductor substrate and a metal post on the hole to allow the metal post to penetrate through the insulating layer; and forming an outer-layer circuit to be electrically connected to the metal post.

At this time, the forming of the hole can be performed such that a depth of the hole is equal to or smaller than a thickness of the semiconductor substrate, and the method can further include, prior to the forming of the outer-layer circuit, removing a part of the semiconductor substrate to expose the metal post.

The forming of the insulating layer and the metal post can include: forming the insulating layer on one surface of the semiconductor substrate, an opening being formed on the insulating layer corresponding to a position of the conductive pad; and forming the metal post by filling a conductive material inside the hole and the opening.

The method can further include, after the forming of the outer-layer circuit, forming a solder bump on the outer-layer circuit.

DETAIL DESCRIPTION

Figure 1:
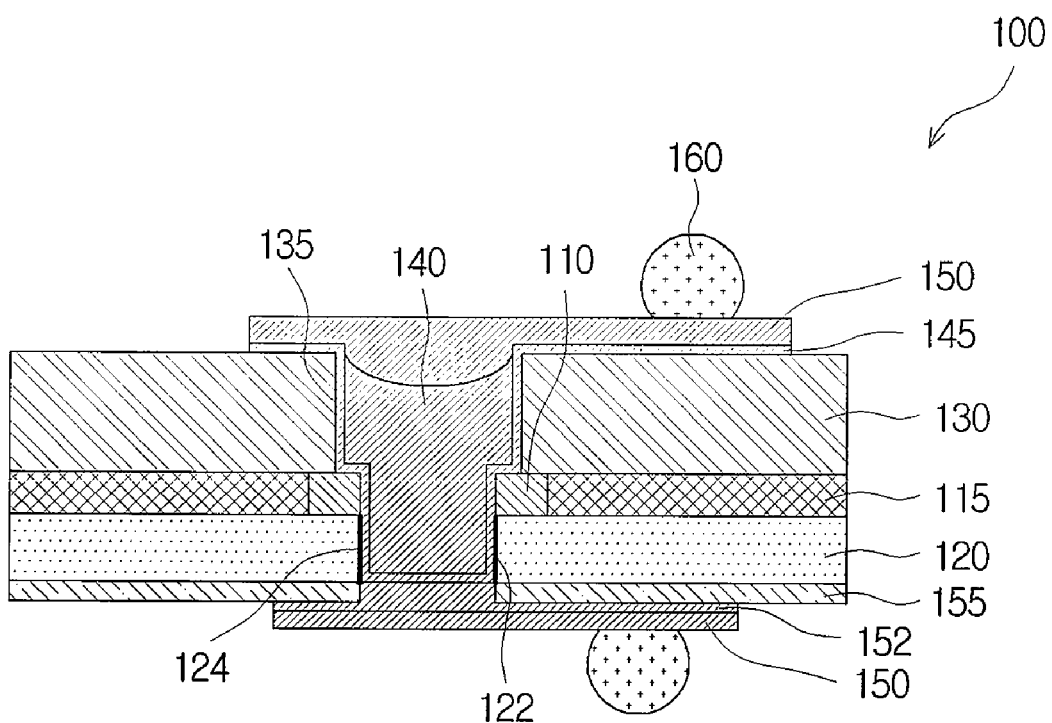
FIG. 1 is a cross-sectional view showing a semiconductor package in accordance with an embodiment based on an aspect of the present invention.

A semiconductor package and a manufacturing method thereof in accordance with an embodiment of the present invention will be described in detail with reference to the accompanying drawings. Throughout the drawings, similar or identical elements are given the same reference numerals. Throughout the description of the present invention, when describing a certain technology is determined to evade the point of the present invention, the pertinent detailed description will be omitted.

When one element is described "to form", "being formed on" or "forming" another element, it shall be construed as being formed on another element directly but also as possibly having yet another element in between.

FIG. 1 is a cross-sectional view showing a semiconductor package 100 in accordance with an embodiment based on an aspect of the present invention.

The semiconductor package 100 in accordance with an embodiment based on an aspect of the present invention can include a semiconductor substrate 120 having one surface formed with a conductive pad 110, an insulating layer 130 formed on one surface of the semiconductor substrate 120, a metal post 140 penetrating though the conductive pad 110, the semiconductor substrate 120 and the insulating layer 130, and an outer-layer circuit 150 electrically connected to the metal post 140.

In accordance with such embodiment based on an aspect of the present invention, it may become unnecessary to form an additional via for electrically connecting both surfaces of the semiconductor substrate 120, by forming the metal post 140 penetrating through the conductive pad 110, the semiconductor substrate 120 and the insulating layer 130, thereby simplifying the manufacturing process, reducing the manufacturing cost, and improving the coupling reliability of the inside of the semiconductor package 100, as compared with the case of forming the via separately from the metal post 140.

Hereinafter, each element will be described in more detail.

The semiconductor substrate 120 can be made of, for example, silicon (Si), and the conductive pad 110, such as a metal pad, can be formed on one surface of the semiconductor substrate 120 to be electrically connected to an external device. Moreover, an insulating film 115, such as oxide film, can be formed on one surface of the semiconductor substrate 120, and a through-hole can be formed corresponding to a position of the conductive pad 110 to expose the conductive pad 110.

A hole 122 can be formed on one surface of the semiconductor substrate 120 to penetrate through the conductive pad 110. At this time, an insulating film 124 such as an oxide film can be formed inside the hole 122 to electrically insulate the semiconductor substrate 120 and the metal post 140.

Such hole 122 can be formed by dry or wet etching, and the metal post 140 can be formed in the hole 122. This will be described in more detail in the method of manufacturing the semiconductor package 200 (refer to FIGS. 12, 21, 31, 42, 54 and 66) according to an embodiment and another embodiment based on an aspect of the present invention, which will be described below.

The insulating layer 130 can be formed on one surface of the semiconductor substrate 120. In particular, the insulating layer 130 can be formed to cover the conductive pad 110 and the insulating film 115, formed on one surface of the semiconductor substrate 120, and the metal post 140, which will be described below, can penetrate through the insulating layer 130.

The metal post 140 can penetrate through the conductive pad 110, the semiconductor substrate 120 and the insulating layer 130. When the semiconductor package 100 is connected to an external device, the metal post 140 can penetrate through the insulating layer 130 so as to increase a supporting force of widthwise weight and can electrically connect both surfaces of the semiconductor substrate 120 by penetrating through the conductive pad 110 and the semiconductor substrate 120.

As such, the metal post 140 can be formed penetrating through the conductive pad 110, the semiconductor substrate 120 and the insulating layer 130 to additionally function as the via. Accordingly, it can become unnecessary to form an additional via that penetrates through the semiconductor substrate 120, thereby simplifying the manufacturing process, reducing the manufacturing cost and improving the coupling reliability of the inside of the semiconductor package 100, as compared with the case of forming the via separately from the metal post 140.

As such, the aforementioned insulating layer 130 can be formed on one surface of the semiconductor substrate 120 on which the hole 122 is formed, and then an opening 135 can be formed corresponding to positions of the conductive pad 110 and the hole 122, on the insulating layer 130. Then, the metal post 140 can be formed by forming a seed layer 145 and filling a conductive material in the hole 122 and the opening 135 or can be formed on the hole 122 of the semiconductor substrate 120 by using a plating resist before the insulating layer 130 is formed.

Alternatively, the metal post 140 can be formed in various ways. This will be described in more detail in the method of manufacturing the semiconductor package 200 (refer to FIGS. 12, 21, 31, 42, 54 and 66) according to an embodiment and another embodiment based on an aspect of the present invention, which will be described below.

The outer-layer circuit 150 can be electrically connected to the metal post 140. In particular, the outer-layer circuit 150 can be formed on the seed layer 145, formed on the surface of the insulating layer 130, by the electroplating. An insulating film 155 for electrically insulating the outer-layer circuit 150 and the semiconductor substrate 120 can be formed on the other surface of the semiconductor substrate 120, before the outer-layer circuit 150 is formed. Then, the outer-layer circuit 150 can be formed by the electroplating, by forming a seed layer 152 on the insulating film 155.

A solder bump 160 can be formed in the outer-layer circuit 150. Particularly, a solder ball or a solder paste, for example, can be formed in the outer-layer circuit 150.

Described below is a semiconductor package 100 in accordance with another embodiment based on an aspect of the present invention.

Figure 2:
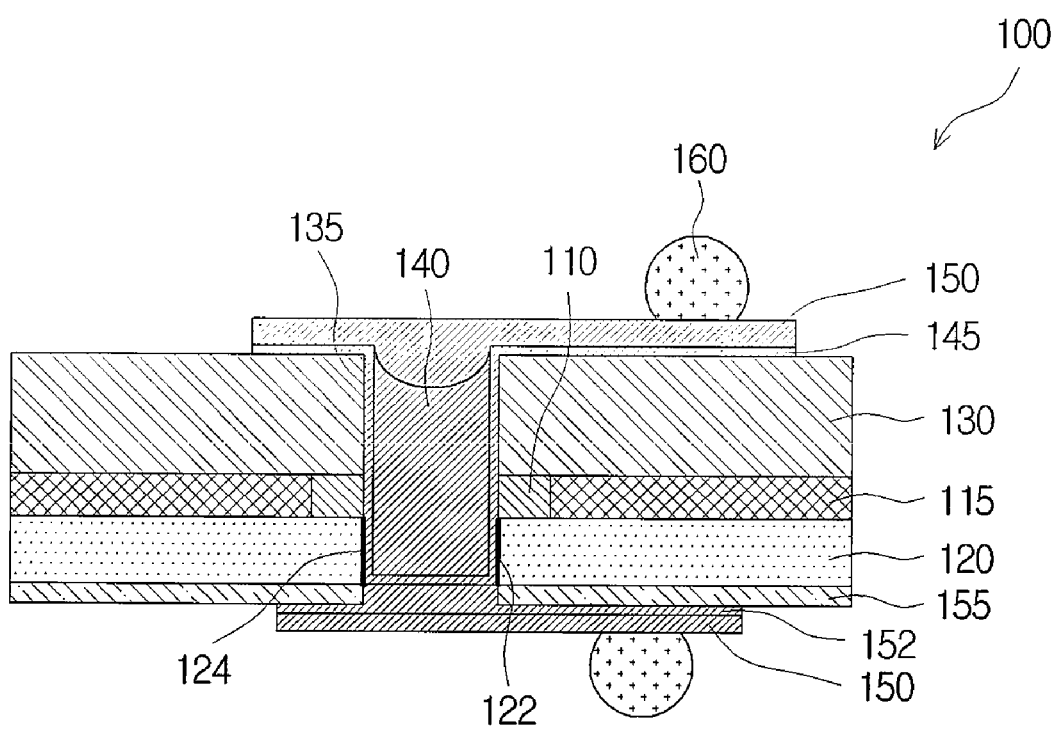
FIG. 2 is a cross-sectional view showing a semiconductor package in accordance with another embodiment based on an aspect of the present invention.

FIG. 2 is a cross-sectional view showing the semiconductor package 100 in accordance with another embodiment based on an aspect of the present invention.

In accordance with another embodiment based on an aspect of the present invention, the conductive pad 110, the insulating film 115, the semiconductor substrate 120, the hole 122, the insulating film 124, the insulation layer 130, the opening 135, the seed layer 145, the outer-layer circuit 150, the seed layer 152, the insulating film 155 and the solder bump 160 are identical or similar to those of the aforementioned embodiment. Accordingly, the redundant description will be omitted, but the metal post 140, which is different from the aforementioned embodiment, will be described below.

According to another embodiment based on an aspect of the present invention, an outer circumferential surface of the metal post 140 may not be stepped, as shown in FIG. 2. For example, when the insulating layer 130 on which the opening 135 is formed is firstly formed on the semiconductor substrate 120 and then the hole 122 is formed on the semiconductor substrate 120 by using the insulating layer 130 as an etching resist, the diameter of the opening 135 can be identical or similar to that of the hole 122. As a result, the metal post 140 can be formed by filling a conductive material in the opening 135 and the hole 122. This will be described in more detail in the method of manufacturing the semiconductor package 200 (refer to FIGS. 12, 21, 31, 42, 54 and 66) according to an embodiment and another embodiment based on an aspect of the present invention, which will be described below.

Described below is a method of manufacturing a semiconductor package 200 in accordance with a first embodiment based on another aspect of the present invention.

Figure 3:
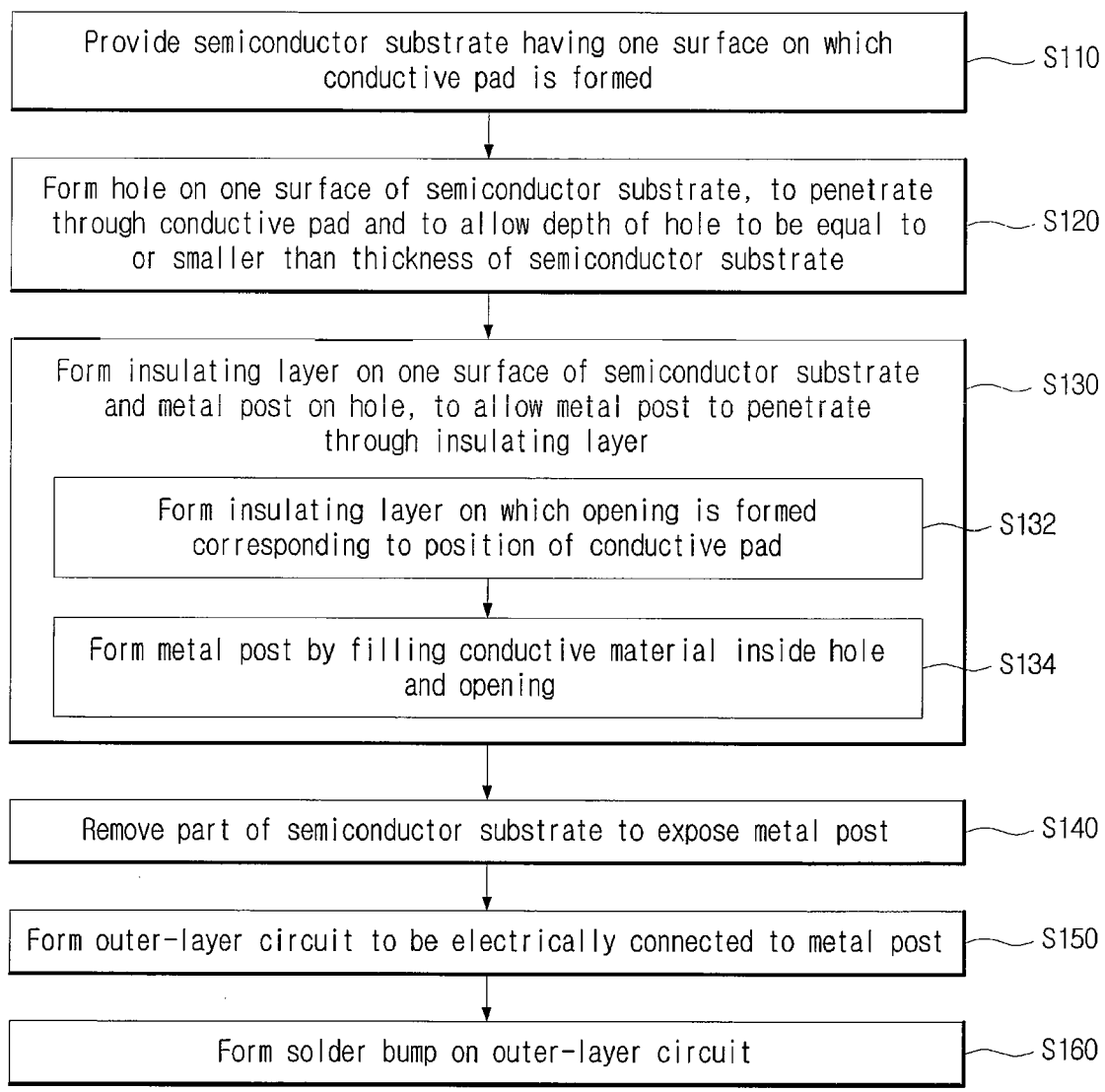
FIG. 3 is a flowchart showing a semiconductor package manufacturing method in accordance with a first embodiment based on another aspect of the present invention.

FIG. 3 is a flowchart showing the method of manufacturing a semiconductor package 200 in accordance with the first embodiment based on another aspect of the present invention, and FIG. 4 through FIG. 12 are cross-sectional views showing each process of the method of manufacturing a semiconductor package 200 in accordance with the first embodiment based on another aspect of the present invention.

The method of manufacturing a semiconductor package 200 in accordance with this embodiment based an aspect of the present invention can include: providing a semiconductor substrate 220 having one surface on which a conductive pad 210 is formed; forming a hole 222 on one surface of the semiconductor substrate 220 to penetrate the conductive pad 210; forming an insulating layer 230 on one surface of the semiconductor substrate 220 and a metal post 240 on the hole 222 such that the metal post 240 penetrates through the insulating layer 230; and forming an outer-layer circuit 250 to be electrically connected to the metal post 240.

In accordance with the first embodiment based on another aspect of the present invention, it may become unnecessary to form an additional via for electrically connecting both surfaces of the semiconductor substrate 220, by forming the metal post 240 on the hole 222 formed in the semiconductor substrate 220, thereby simplifying the manufacturing process, reducing the manufacturing cost and improving the coupling reliability of the inside of the semiconductor package 200, as compared with the case of forming the via separately from the metal post 240.

Hereinafter, each process will be described in more detail.

Figure 4:
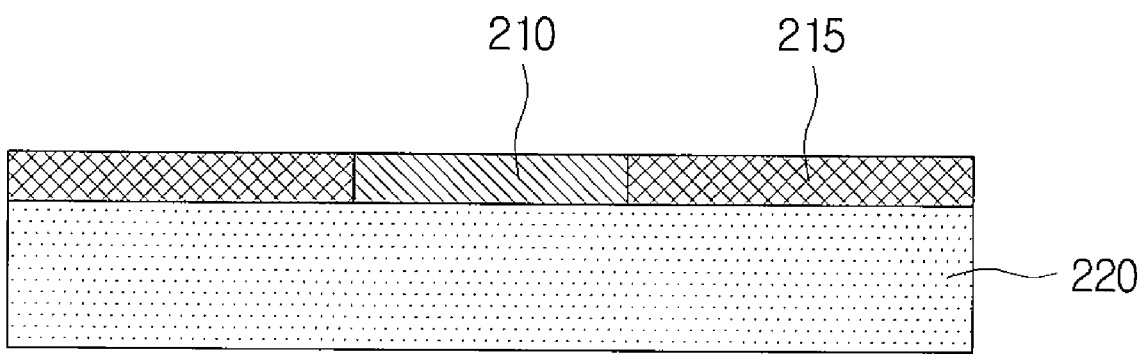
FIG. 4 through FIG. 12 are cross-sectional views showing each process of a semiconductor package manufacturing method in accordance with a first embodiment based on another aspect of the present invention.

Firstly, a process represented by S110 can provide the semiconductor substrate 220 having one surface on which the conductive pad 210 is formed, as shown in FIG. 4. Here, the semiconductor substrate 220 can be made of, for example, silicon (Si). The conductive pad 210, for example, a metal pad, can be formed on one surface of the semiconductor substrate 220 to be electrically connected to an external device.

Moreover, an insulation film 215, such as an oxide film, can be formed on one surface of the semiconductor substrate 220, and a through-hole can be formed corresponding to a position of the conductive pad 210 to expose the conductive pad 210.

Figure 5:
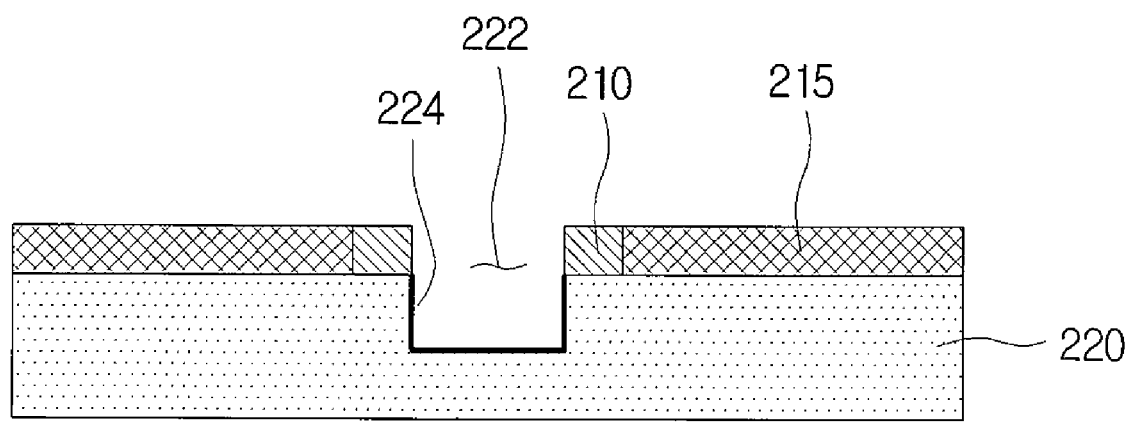

Then, a process represented by S120 can form the hole 222 on one surface of the semiconductor substrate 220, to penetrate through the conductive pad 210 and to allow the depth of the hole 222 to be equal to or smaller than the thickness of the semiconductor substrate 220, as shown in FIG. 5. For example, this process can form the hole 222 on one surface of the semiconductor substrate 220 to penetrate through the conductive pad 210 through dry or wet etching. Here, since the depth of the hole 222 is smaller than the thickness of the semiconductor substrate 220, the hole 222 does not penetrate through the semiconductor substrate 220.

As such, the metal post 240 can be formed so as to have a via as one body in a simple process without an additional via for electrically connecting both surfaces of the semiconductor substrate 220 because the hole 222 for forming the metal post 240 is formed on the semiconductor substrate 220. This can simplify the manufacturing process and reduce the manufacturing cost.

As such, since the metal post 240 having a via is formed as one body, it is also possible to improve the coupling reliability of the inside of the semiconductor package 200, as compared with the case of forming a separate via from the metal post.

By forming the hole 222 such that the depth of the hole 222 is equal to or smaller than the thickness of the semiconductor substrate 220, it is possible to easily fill a conductive material in the hole 222 by plating later, thereby more efficiently forming the metal post 240.

Although it is described in this first embodiment based on another aspect of the present invention that the hole 222 is formed such that the depth of the hole 222 is equal to or smaller than the thickness of the semiconductor substrate 220 and thus the hole 222 does not penetrate through the semiconductor substrate 220, it is also possible that the hole 222 is formed to penetrate through the semiconductor substrate 220. This shall be included in the scope of claims of the present invention.

Following this process of forming the hole 222, an insulating film 224, such as an oxide film, can be formed to allow the metal post 240, which will be formed later, to be insulated from the semiconductor substrate 220, as shown in FIG. 5.

Figure 6:
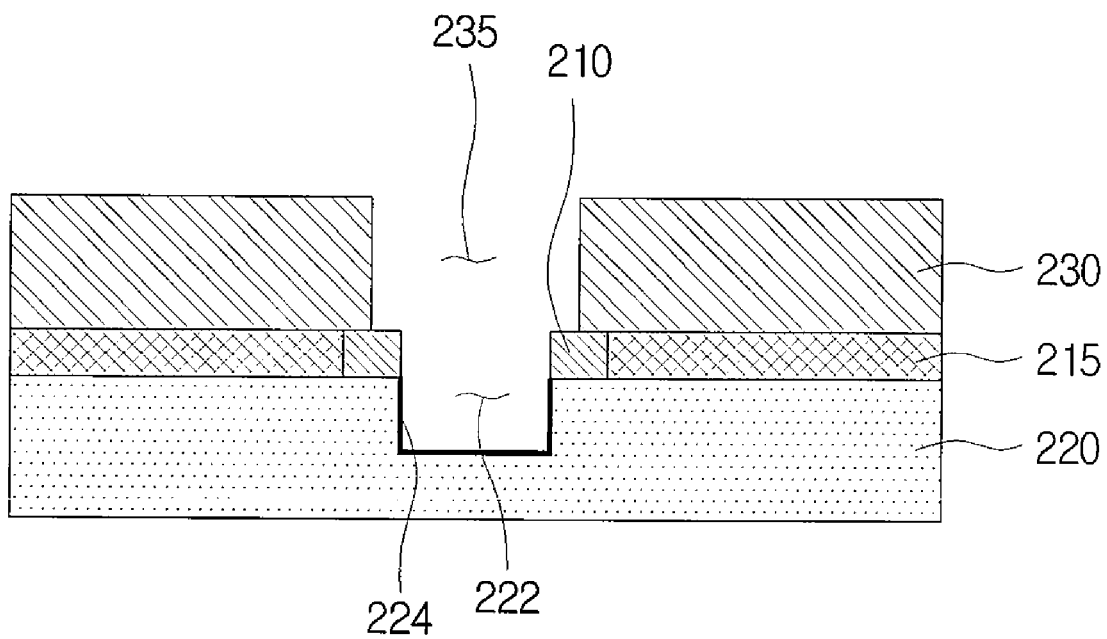
Figure 7:
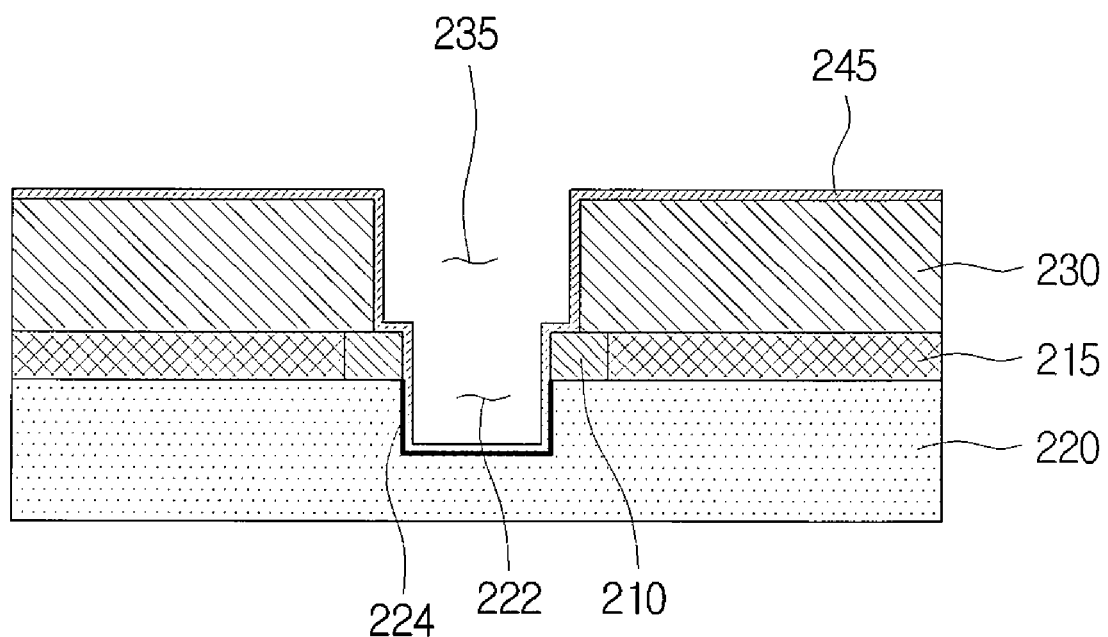
Figure 8:
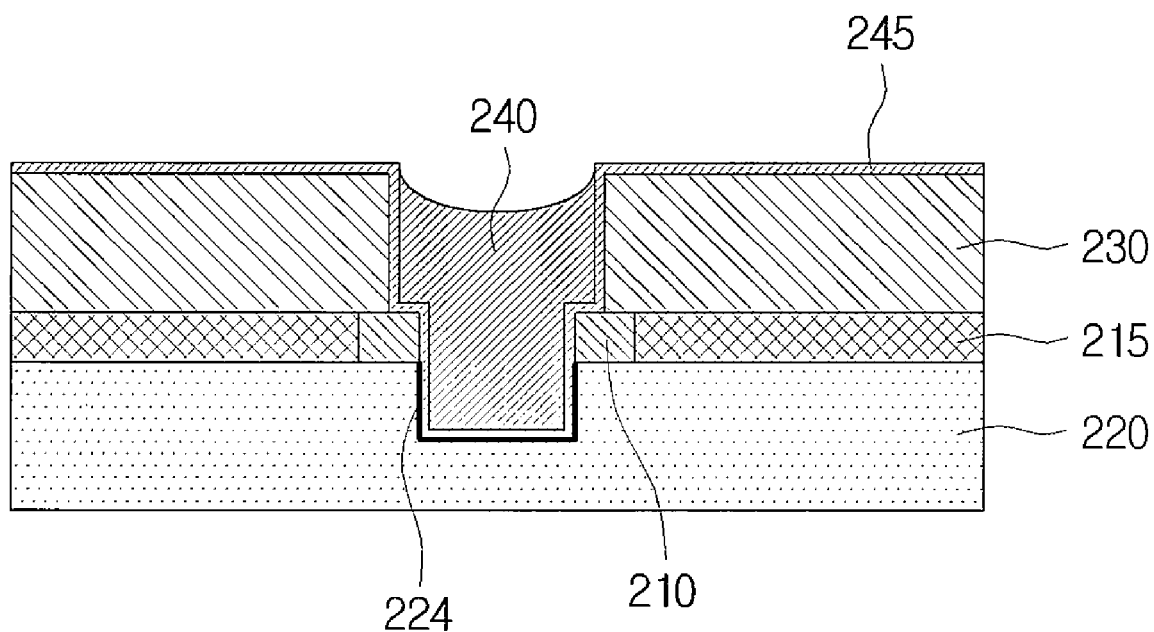

Next, a process presented by S130 can form the insulating layer 230 on one surface of the semiconductor substrate 220 and the metal post 240 on the hole 222, allowing the metal post 240 to penetrate through the insulating layer 230, as shown in FIG. 6 through FIG. 8.

When the insulating layer 230 is formed on one surface of the semiconductor substrate 220 and the metal post 240 is formed on the hole 222, the metal post 240 can be formed to fill the hole 222 of the semiconductor substrate 220 to function as a via for electrically connecting both surfaces of the semiconductor substrate 220.

The process of forming the insulating layer 230 and the metal post 240 can be divided as follows.

Firstly, a process represented by S132 can form the insulating layer 230 on which an opening 235 is formed corresponding to a position of the conductive pad 210. That is, the process can form the insulating layer 230 on one surface of the semiconductor substrate 220 and then form the opening 235 to correspond to a position of the conductive pad 210, by, for example, photo-lithography.

Then, a process represented by S134 can form the metal post 240 by filling a conductive material inside the hole 222 and the opening 235, as shown in FIG. 7 and FIG. 8. The process can be performed by using the electroplating. That is, a seed layer 245 can be formed inside the hole 222 and the opening 235 to use the electroplating, as shown in FIG. 7. Thereafter, the conductive material can be filled inside the hole 222 and the opening 235 by using the seed layer 245 to form the metal post 240, as shown in FIG. 8.

Such metal post 240, as described above, can not only function as a via that electrically connects both surfaces of the semiconductor substrate 220 but also perform the original function of a metal post that relaxes a widthwise stress when the semiconductor substrate 220 is coupled to an external device by the soldering.

Figure 9:
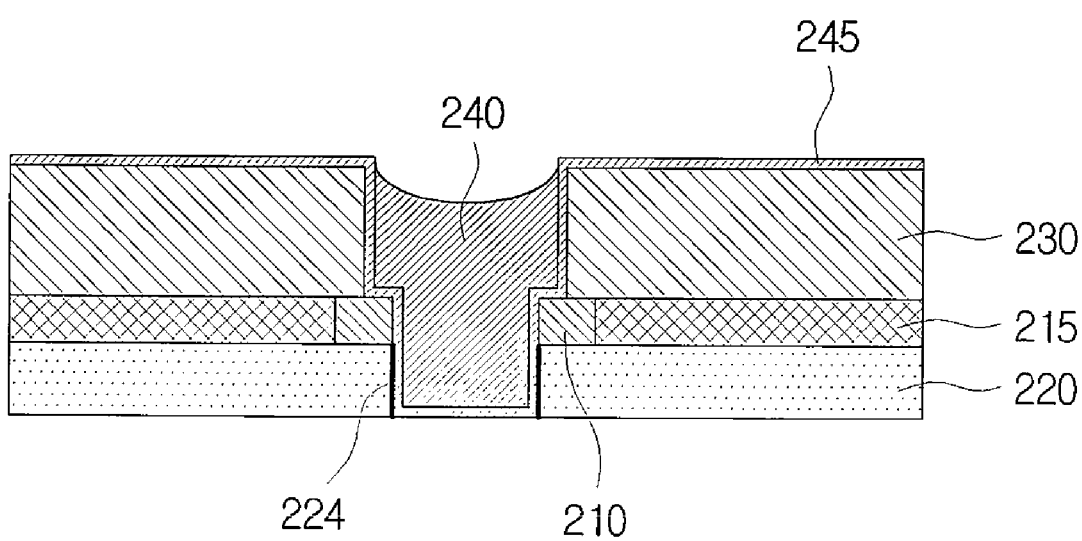

Next, a process represented by S140 can remove a part of the semiconductor substrate 220 to expose the metal post 240, as shown in FIG. 9. As described above, the hole 222 can be formed such that the depth of the hole 222 is smaller than the thickness of the semiconductor substrate 220. In this case, it may be necessary that a part of the semiconductor substrate 220 is removed to expose the metal post 240 on the other surface of the semiconductor substrate 220.

At this time, it may be also necessary that a part of the insulating film 224 formed inside the hole 222 is removed to allow the metal post to be electrically connected to the outer-layer circuit 250, which will be formed later.

Figure 10:
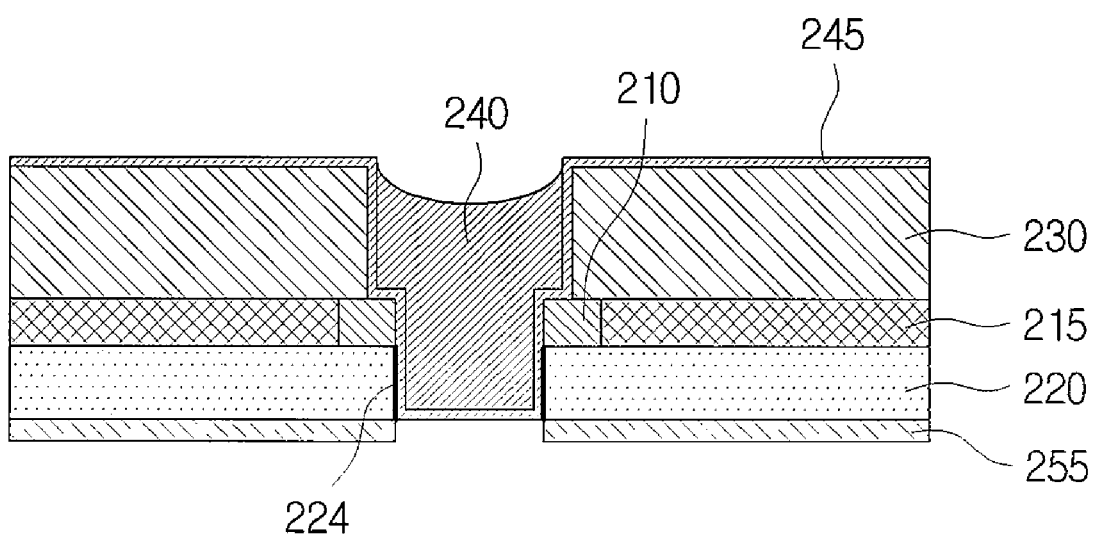
Figure 11:
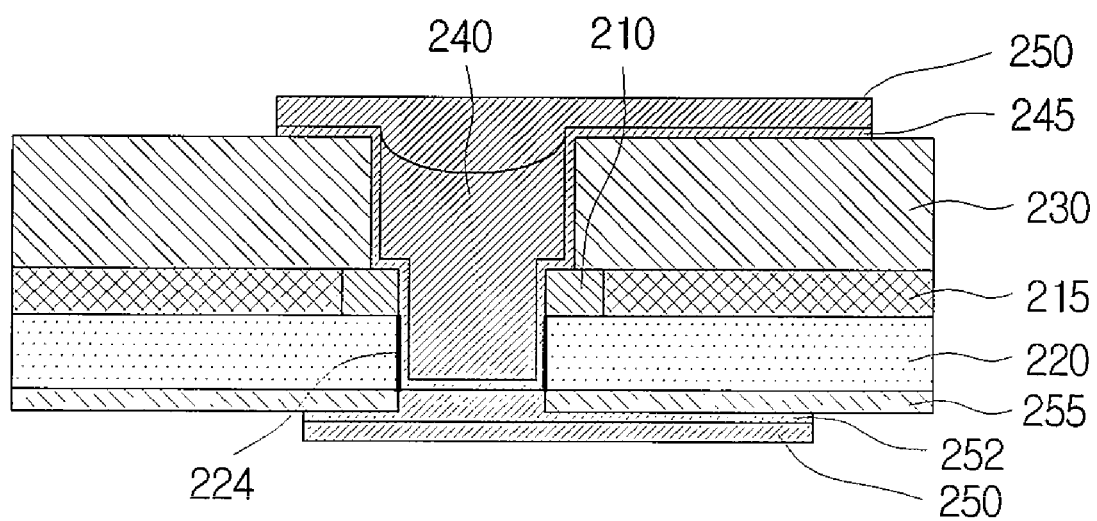

Then, a process represented by S150 can form the outer-layer circuit 250 to be electrically connected to the metal post 240, as shown in FIG. 10 and FIG. 11. Firstly, as shown in FIG. 10, an insulating film 255 that is similar to the insulating film 224 formed inside the hole 222 can be formed on the other surface of the semiconductor substrate 220 to electrically insulate the semiconductor substrate 220 and the outer-layer circuit 250, and a part of the insulating film 255 can be removed by the photo-lithography to expose the metal post 240 to the outside.

Thereafter, as shown in FIG. 11, a seed layer 252 can be formed on a surface of the insulating film 255, and then the outer-layer circuit 250 can be formed on the seed layer 245 and the seed layer 252 by the electroplating. After the outer-layer circuit 250 is formed, some parts of the seed layers 245 and 252 may remain by removing parts of the seed layers 245 and 252, on which no outer-layer circuit 250 is formed.

Figure 12:
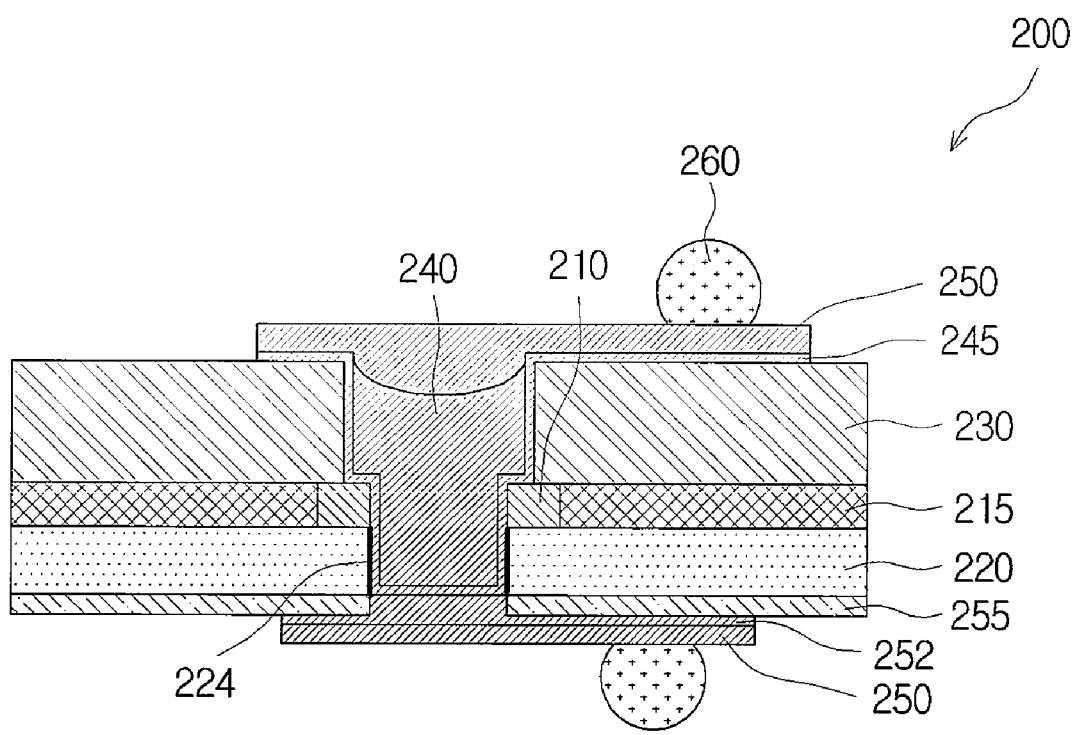

In addition, a process represented by S160 can form a solder bump 260 on the outer-layer circuit 250, as shown in FIG. 12. For example, a solder ball or a solder paste can be formed on the outer-layer circuit 250.

Described below is each process of a method of manufacturing a semiconductor package 200 in accordance with other embodiments based on another aspect of the present invention.

FIG. 13 through FIG. 21 are cross-sectional views showing each process of the method of manufacturing the semiconductor package 200 in accordance with a second embodiment based on another aspect of the present invention.

Figure 13:
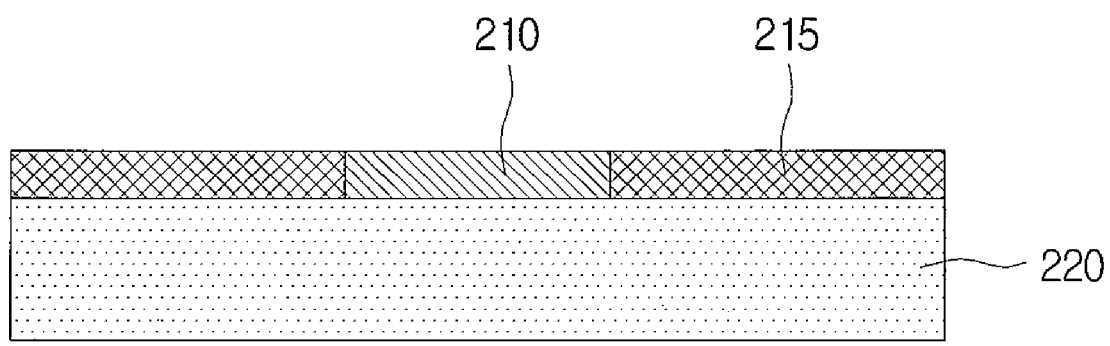
FIG. 13 through FIG. 21 are cross-sectional views showing each process of a semiconductor package manufacturing method in accordance with a second embodiment based on another aspect of the present invention.
Figure 14:
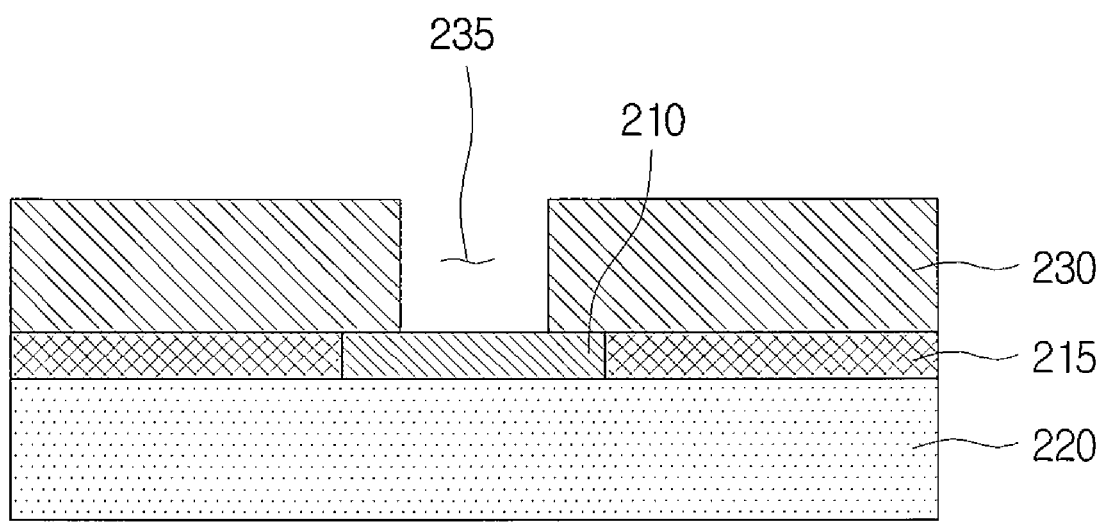

In accordance with the second embodiment based on another aspect of the present invention, a semiconductor substrate 220 having one surface on which a conductive pad 210 can be provided, as shown in FIG. 13 (refer to the process represented by S110 in FIG. 3), and an insulating layer 230 on which an opening 235 is formed corresponding to a position of the conductive pad 210 can be formed on one surface of the semiconductor substrate 220, as shown in FIG. 14 (refer to the process represented by S132 in FIG. 3).

Figure 15:
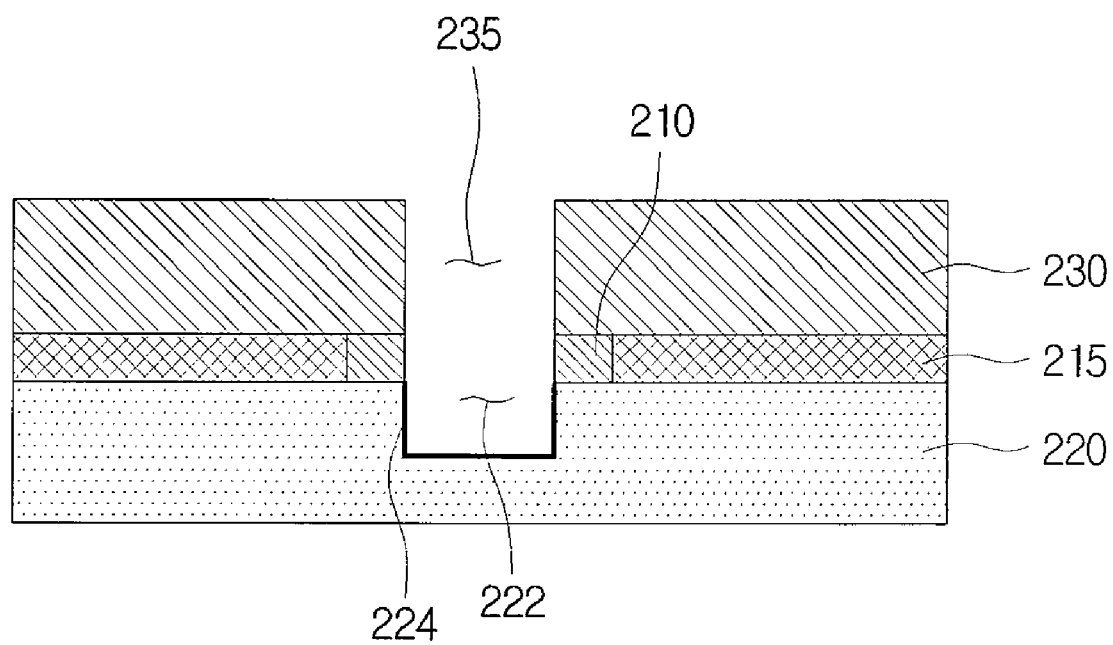
Figure 16:
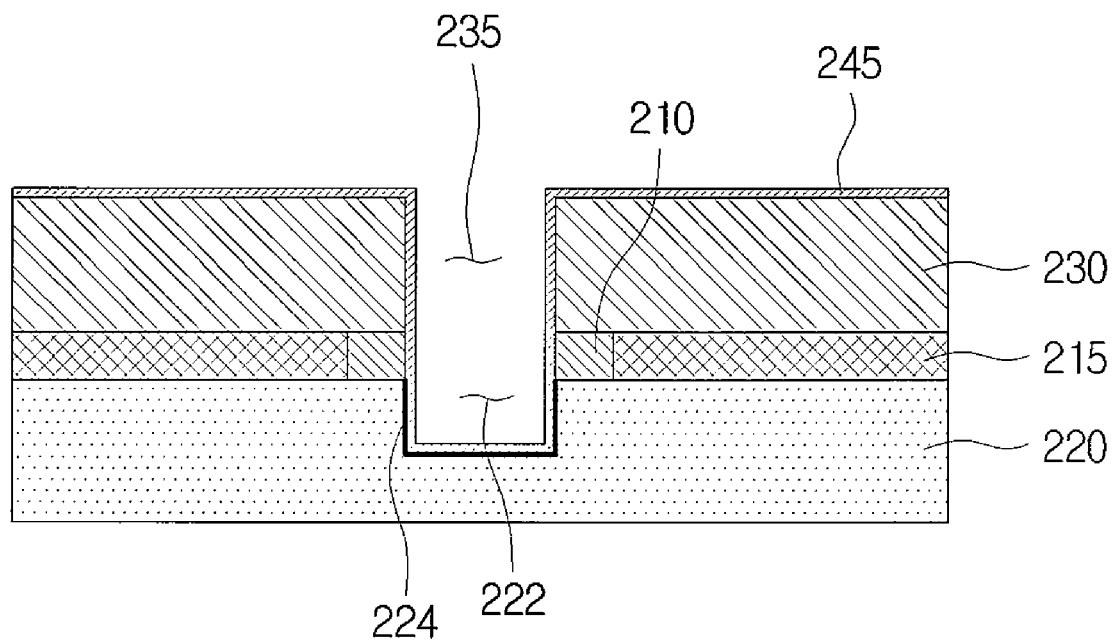
Figure 17:
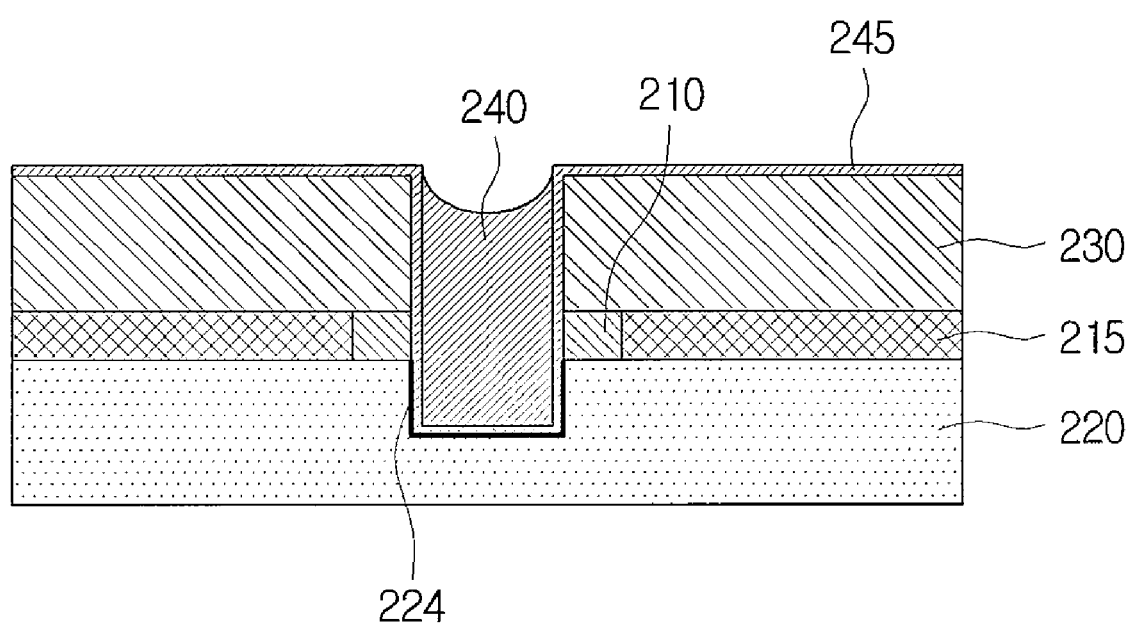

Then, a hole 222 can be formed on one surface of the semiconductor substrate 220 to penetrate through the conductive pad 210 and to allow the depth of the hole 222 to be equal to or smaller than the thickness of the semiconductor substrate 220, as shown in FIG. 15 (refer to the process represented by S120 in FIG. 3), and a metal post 240 can be formed by filling a conductive material inside the hole 222 and the opening 235, as shown in FIG. 16 and FIG. 17 (refer to the process represented by S134 in FIG. 3).

Figure 18:
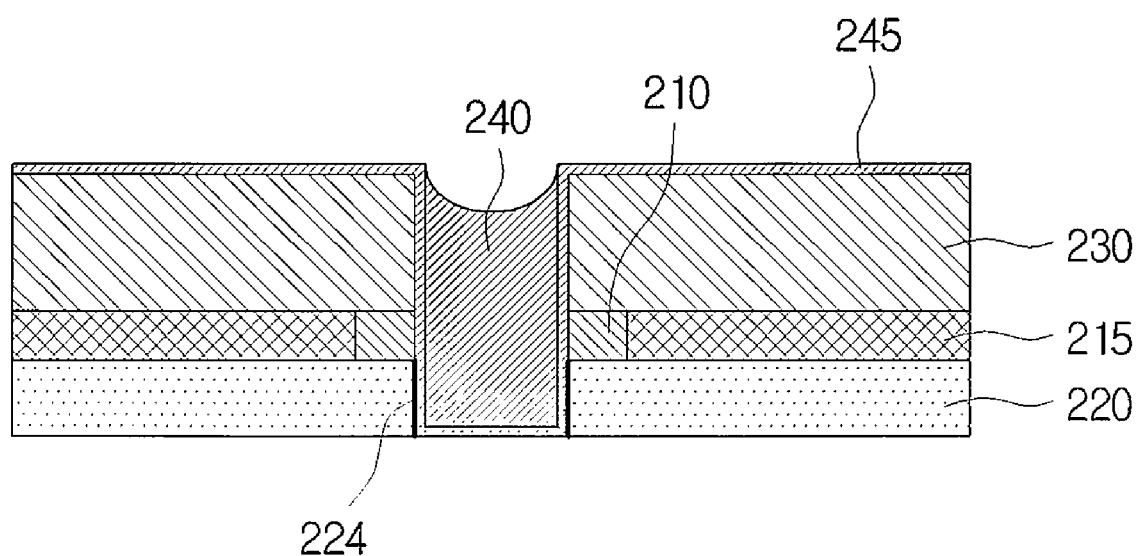
Figure 19:
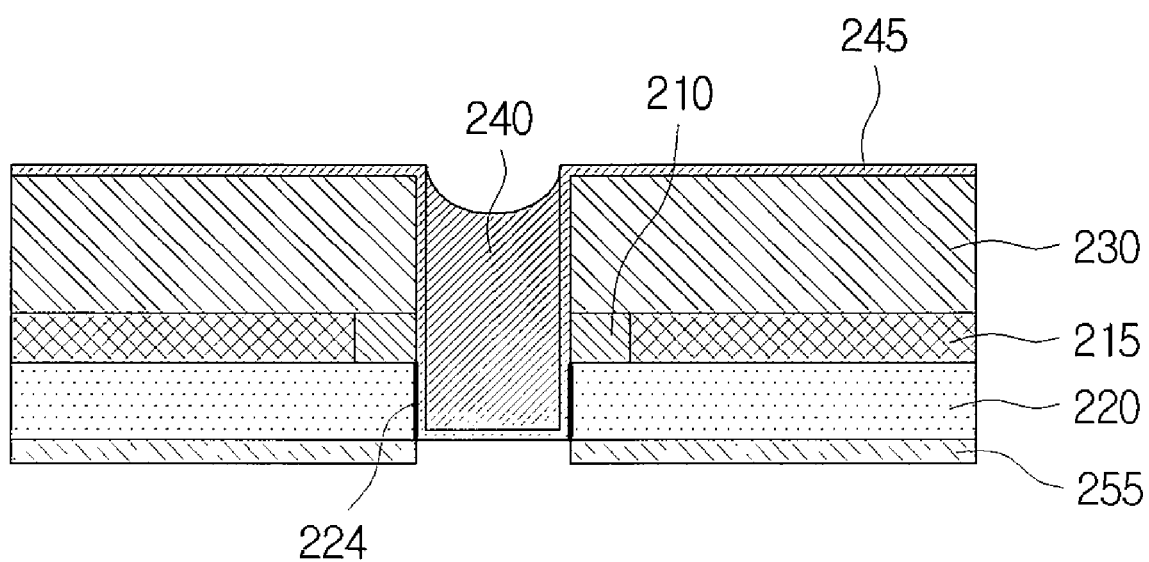
Figure 20:
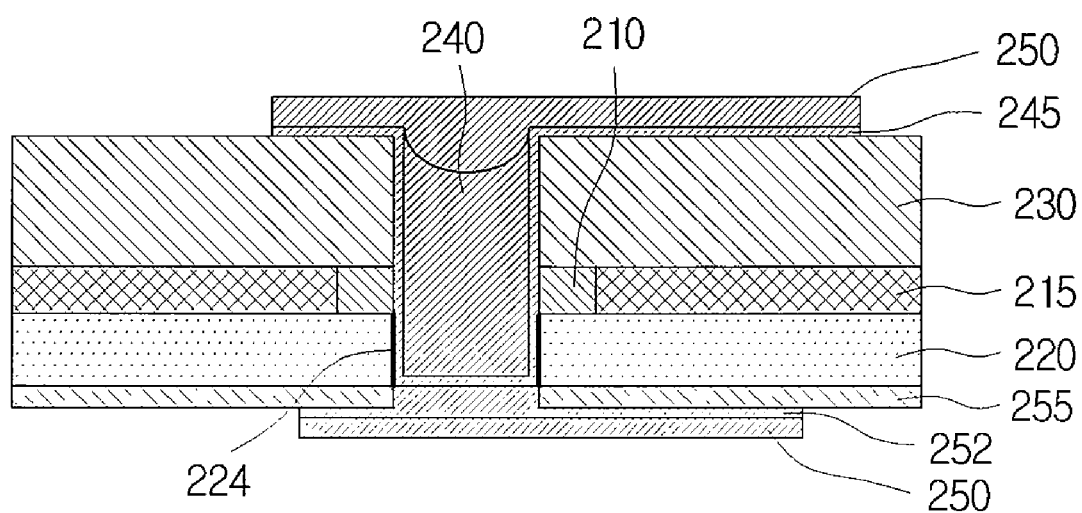
Figure 21:
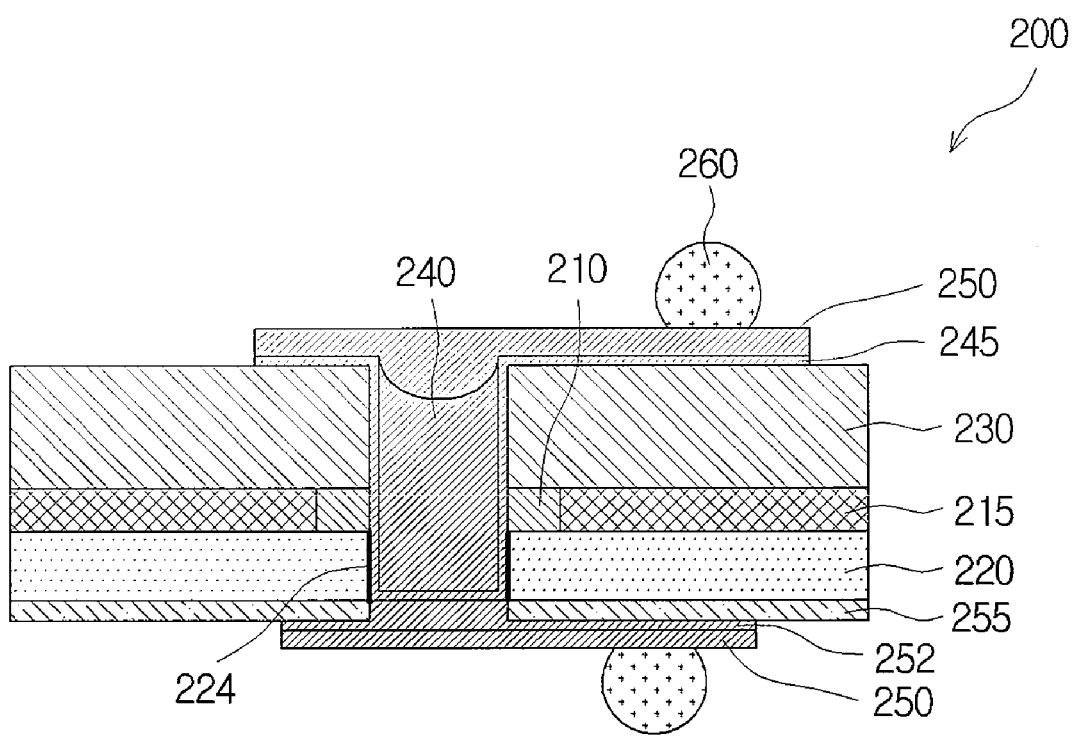

Next, a part of the semiconductor substrate 220 can be removed to expose the metal post 240, as shown in FIG. 18 (refer to the process represented by S140 in FIG. 3). Thereafter, an outer-layer circuit 250 can be formed to be electrically connected to the metal post 240, as shown in FIG. 19 and FIG. 20 (refer to the process represented by S150 in FIG. 3), and a solder bump 260 can be formed on the outer-layer circuit 250, as shown in FIG. 21 (refer to the process represented by S160 in FIG. 3).

In accordance with the second embodiment based on another aspect of the present invention, the order and details of processes may be identical or similar to those of the aforementioned embodiment, except that the order of the process of forming the hole 222 on the semiconductor substrate 220 (refer to the process represented by S120 in FIG. 3) and the process of forming the insulating layer 230 formed with the opening 235 (refer to the process represented by S132 in FIG. 3) are switched. Accordingly, the second embodiment based on another aspect of the present invention will be described below with reference to FIG. 14 and FIG. 15 on the basis of the difference in the two processes (refer to the processes represented by S120 and S132 in FIG. 3).

In other words, in accordance with the second embodiment based on another aspect of the present invention, the insulating layer 230 on which the opening 235 is formed corresponding to the position of the conductive pad 210 can be formed on one surface of the semiconductor substrate 220, as shown in FIG. 14 (refer to the process represented by S132 in FIG. 3), and then the hole 222 can be formed on one surface of the semiconductor substrate 220 to penetrate through the conductive pad 210 and to allow the depth of the hole 222 to be equal to or smaller than the thickness of the semiconductor substrate 220, as shown in FIG. 15 (refer to the process represented by S120 in FIG. 3).

As such, it is possible to use the insulating layer 230 formed with the opening 235 as an etching resist for forming the hole 222 on the semiconductor substrate 220. Accordingly, no additional etching resist may be required to form the hole 222, thereby simplifying the manufacturing process.

In the case of using the insulating layer 230 in accordance with the second embodiment based on another aspect of the present invention, the hole 222 having the diameter that is identical or similar to that of the opening 235 can be formed. Accordingly, the outer circumferential surface of the metal post 240 may not be stepped, as shown in FIG. 17 through FIG. 21.

FIG. 22 through FIG. 31 are cross-sectional views showing each process of a method of manufacturing a semiconductor package 200 in accordance with a third embodiment based on another aspect of the present invention.

Figure 22:
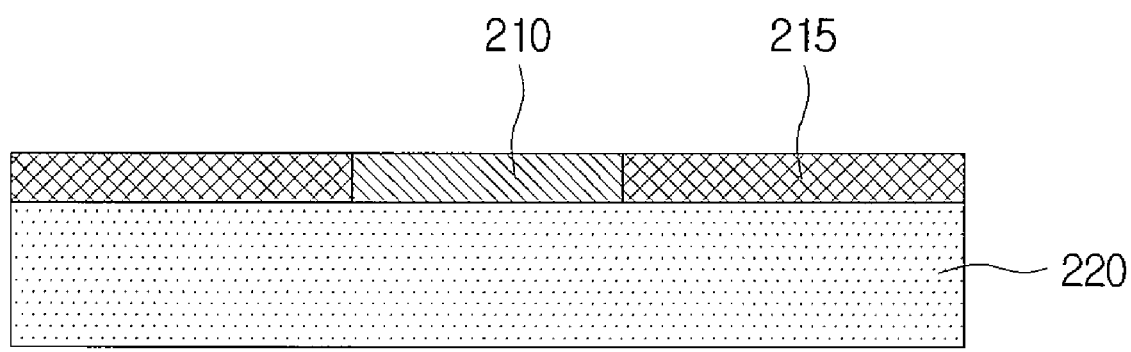
FIG. 22 through FIG. 31 are cross-sectional views showing each process of a semiconductor package manufacturing method in accordance with a third embodiment based on another aspect of the present invention.
Figure 23:
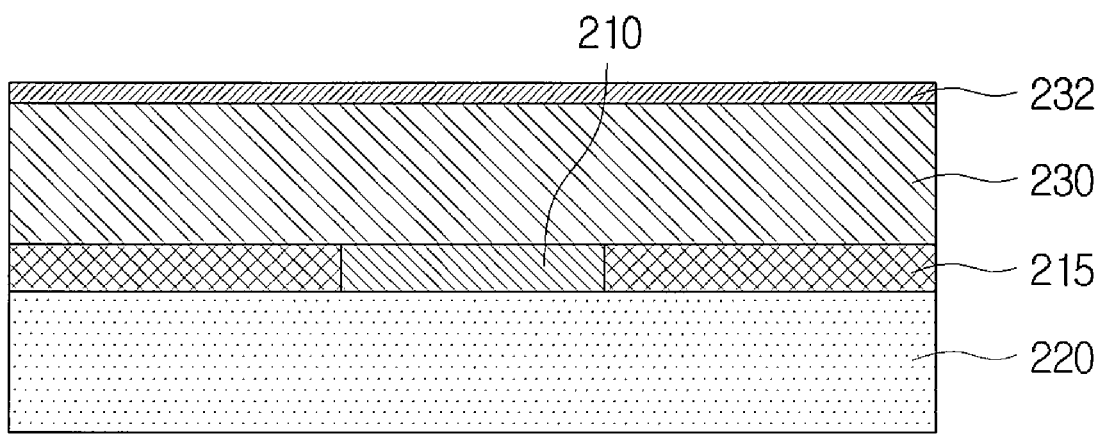
Figure 24:
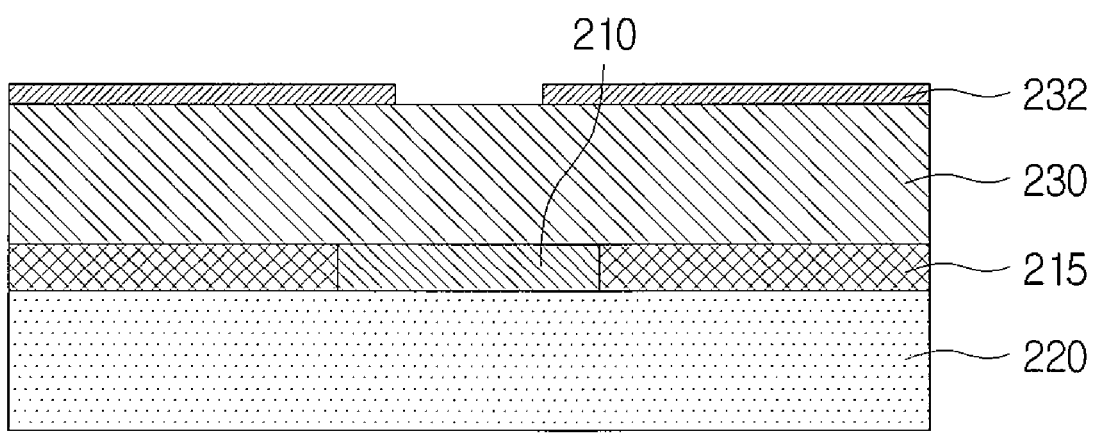
Figure 25:
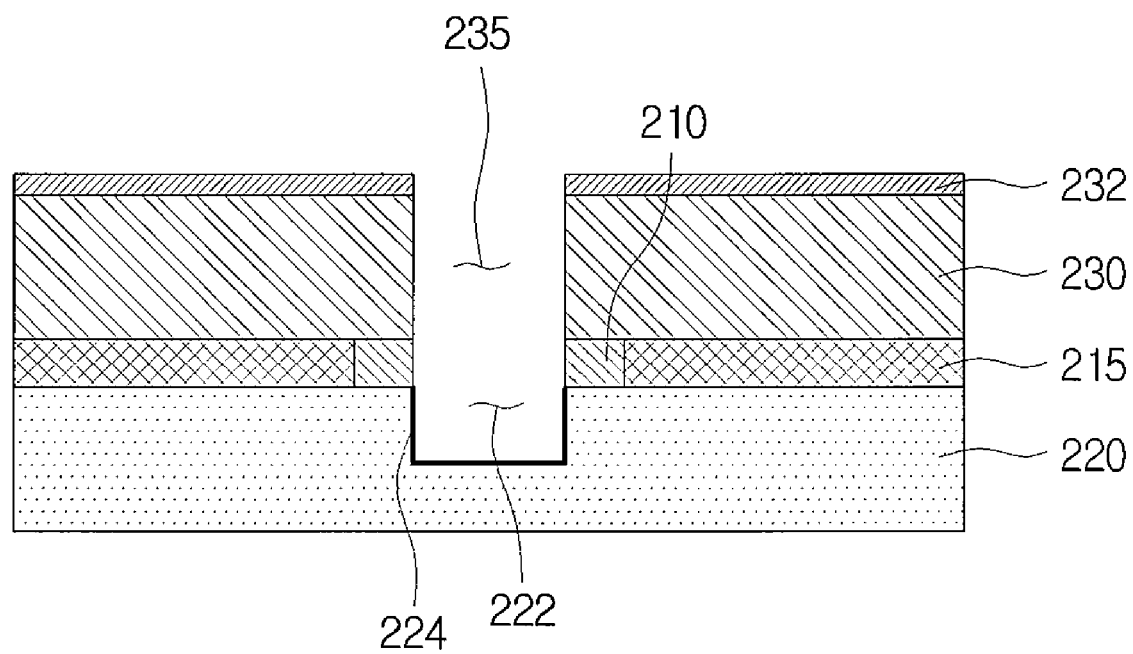

In accordance with the third embodiment based on another aspect of the present invention, a semiconductor substrate 220 having one surface on which a conductive pad 210 can be provided, as shown in FIG. 22 (refer to the process represented by S110 in FIG. 3), and an insulating layer 230 on which the opening 235 is formed corresponding to a position of the conductive pad 210 can be formed on one surface of the semiconductor substrate 220, as shown in FIG. 23 through FIG. 25 (refer to the process represented by S132 in FIG. 3). Then, a hole 222 can be formed on one surface of the semiconductor substrate 220 to penetrate through the conductive pad 210 and to allow the depth of the hole 222 to be equal to or smaller than the thickness of the semiconductor substrate 220, as shown in FIG. 25 (refer to the process represented by S120 in FIG. 3).

Figure 26:
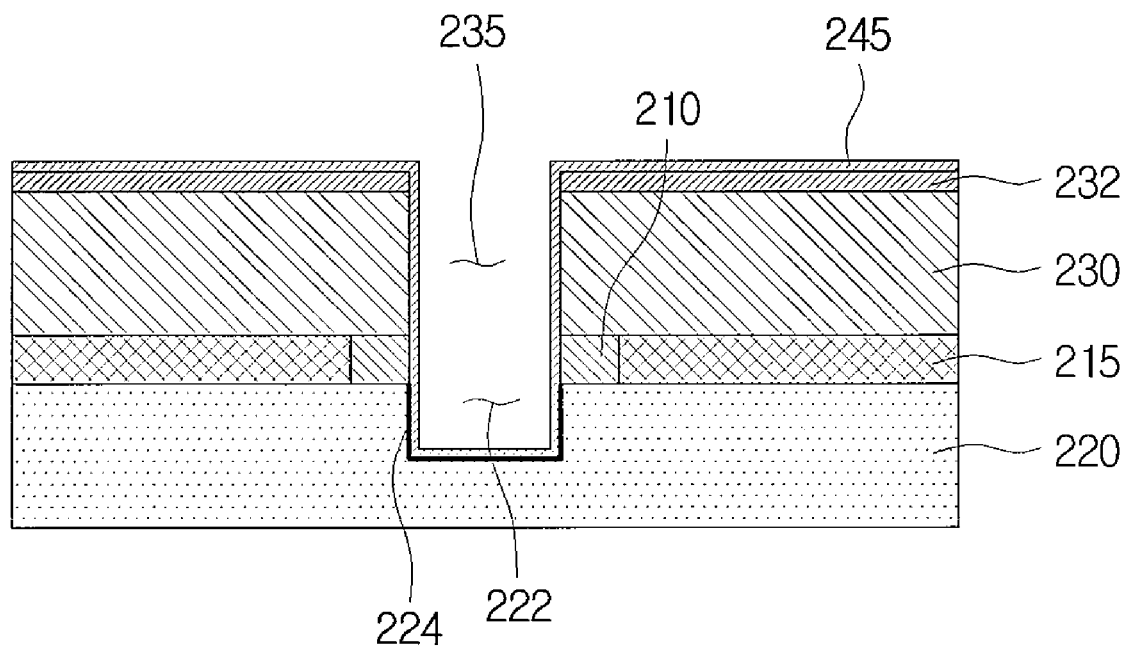
Figure 27:
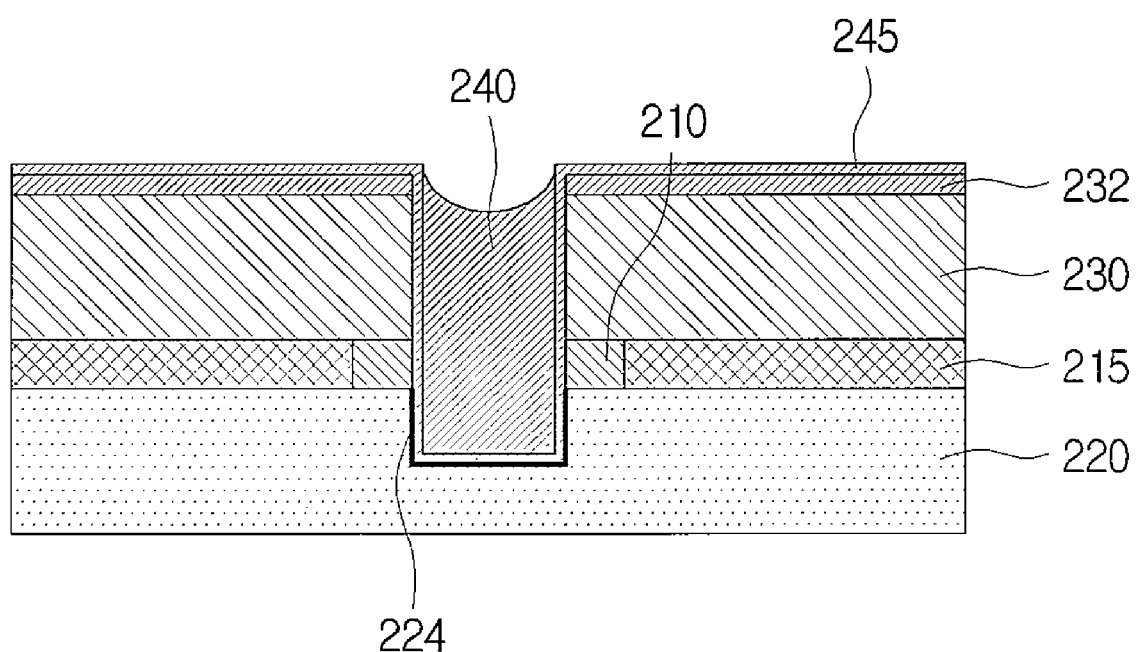
Figure 28:
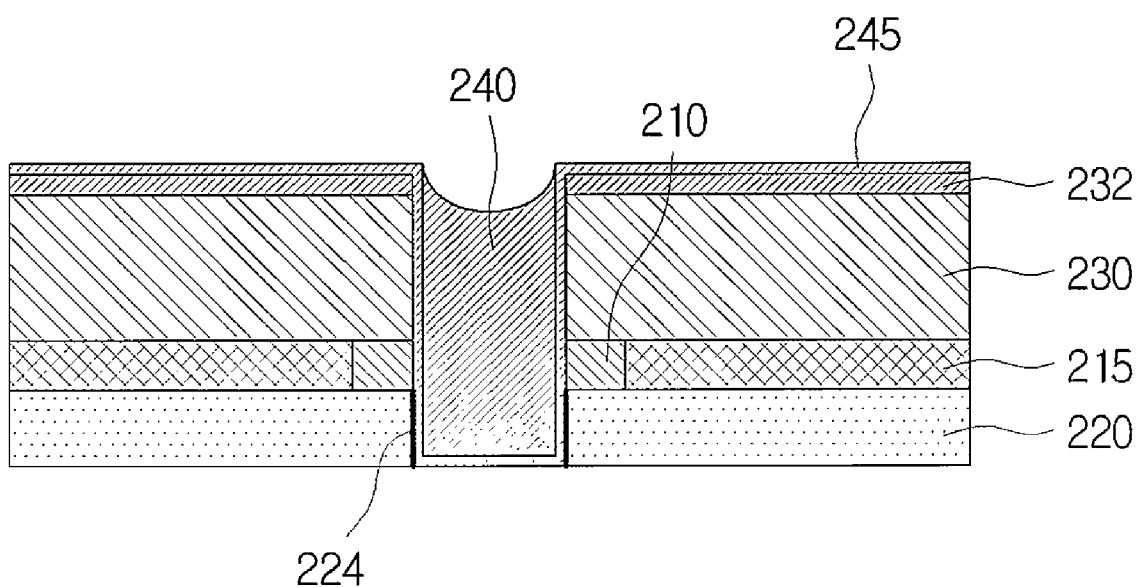
Figure 29:
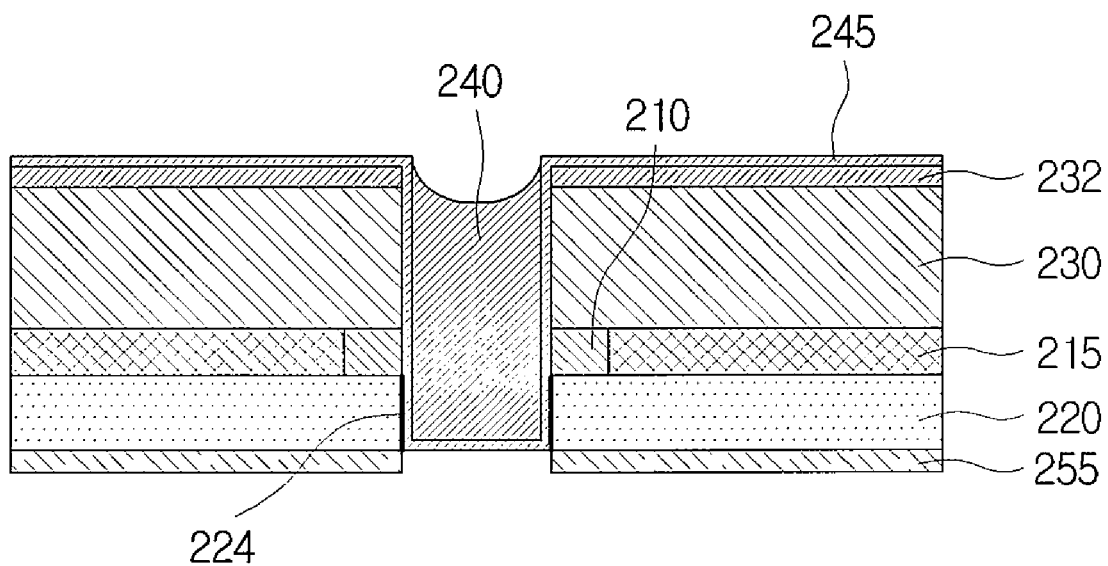
Figure 30:
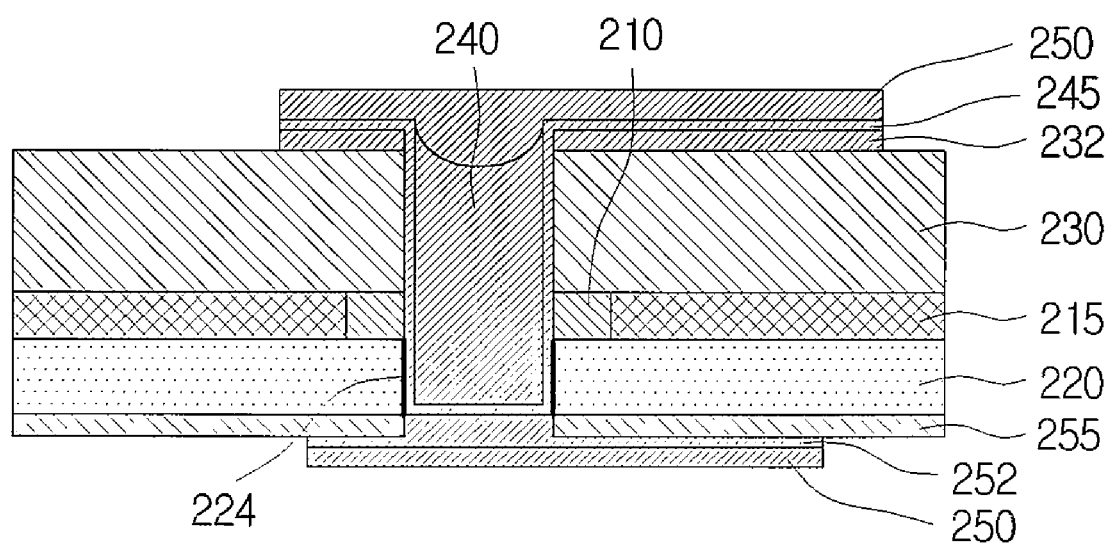
Figure 31:
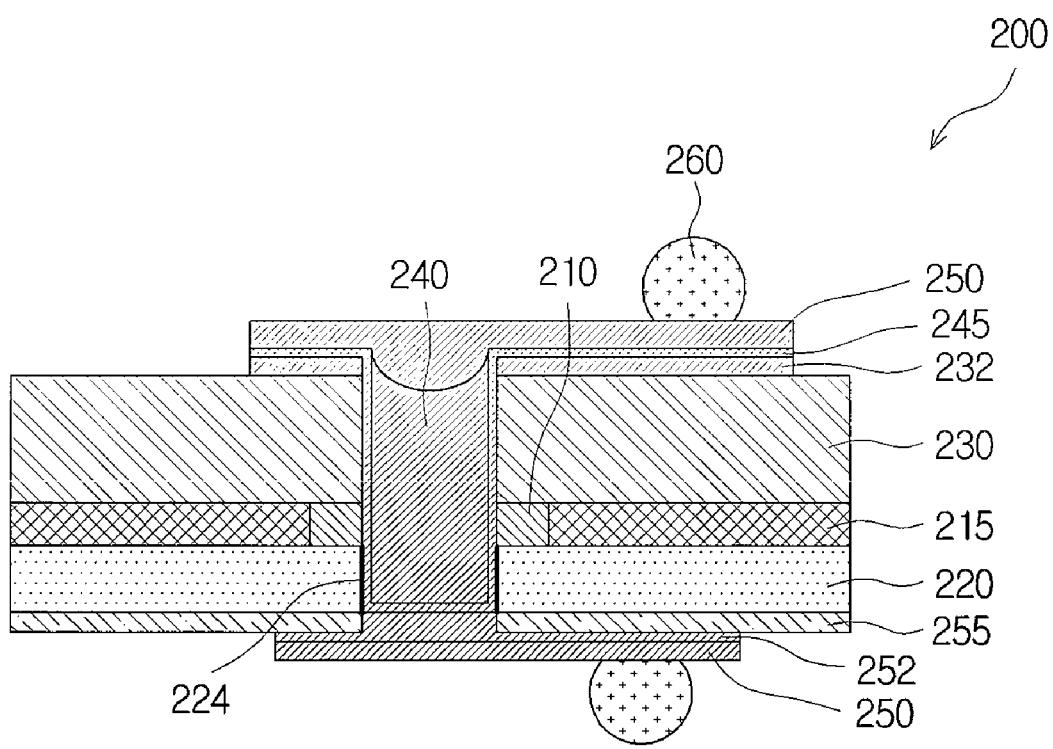

Next, a metal post 240 can be formed by filling a conductive material inside the hole 222 and the opening 235, as shown in FIG. 26 and FIG. 27 (refer to the process represented by S134 in FIG. 3), and a part of the semiconductor substrate 220 can be removed to expose the metal post 240, as shown in FIG. 28 (refer to the process represented by S140 in FIG. 3). Thereafter, an outer-layer circuit 250 can be formed to be electrically connected to the metal post 240, as shown in FIG. 29 and FIG. 30 (refer to the process represented by S150 in FIG. 3), and a solder bump 260 can be formed on the outer-layer circuit 250, as shown in FIG. 31 (refer to the process represented by S160 in FIG. 3).

In accordance with the third embodiment based on another aspect of the present invention, the order and details of processes may be identical or similar to those of the aforementioned embodiment, except that the order of the process of forming the hole 222 on the semiconductor substrate 220 (refer to the process represented by S120 in FIG. 3) and the process of forming the insulating layer 230 formed with the opening 235 (refer to the process represented by S132 in FIG. 3) are switched and the process of forming the insulating layer 230 (refer to the process represented by S132 in FIG. 3) has a partial modification. Accordingly, the third embodiment based on another aspect of the present invention will be described below with reference to FIG. 23 through FIG. 25 on the basis of the two processes (refer to the processes represented by S120 and S132 in FIG. 3).

In other words, in accordance with the third embodiment based on another aspect of the present invention, the insulating layer 230 on which the opening 235 is formed corresponding to the position of the conductive pad 210 can be formed on one surface of the semiconductor substrate 220, as shown in FIG. 23 through FIG. 25 (refer to the process represented by S132 in FIG. 3). In particular, the insulating layer 230 and a copper foil 232 can be stacked on one surface of the semiconductor substrate 220, as shown in FIG. 23, and a part of the copper foil 232 can be etched and removed corresponding to a position of the conductive pad 210, as shown in FIG. 24. Then, the opening 235 can be formed on the insulating layer 230 by the etching that uses the copper foil 232 as an etching resist, as shown in FIG. 25.

Then, the hole 222 can be formed on one surface of the semiconductor substrate 220 to penetrate through the conductive pad 210 and to allow the depth of the hole 222 to be equal to or smaller than the thickness of the semiconductor substrate 220, as shown in FIG. 25 (refer to the process represented by S120 in FIG. 3). In particular, the hole 222 having the diameter that is identical or similar to that of the opening 235 can be formed on one surface of the semiconductor substrate 220 by using the insulating layer 230, on which the opening 235 is formed by using the copper foil 232, as an etching resist.

As a result, in accordance with the third embodiment based on another aspect of the present invention, all processes may be identical to those of the aforementioned second embodiment, except whether the copper foil 232 is used or not. Accordingly, the copper foil 232 may continuously remain in the processes, and thus the copper foil 232 may remain in the semiconductor package 200.

FIG. 32 through FIG. 42 are cross-sectional views showing each process of a method of manufacturing a semiconductor package 200 in accordance with a fourth embodiment based on another aspect of the present invention.

Figure 32:
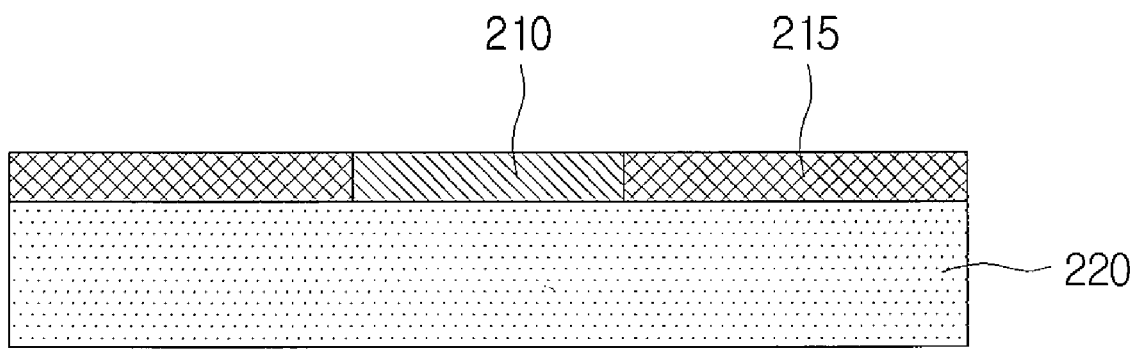
FIG. 32 through FIG. 42 are cross-sectional views showing each process of a semiconductor package manufacturing method in accordance with a fourth embodiment based on another aspect of the present invention.
Figure 33:
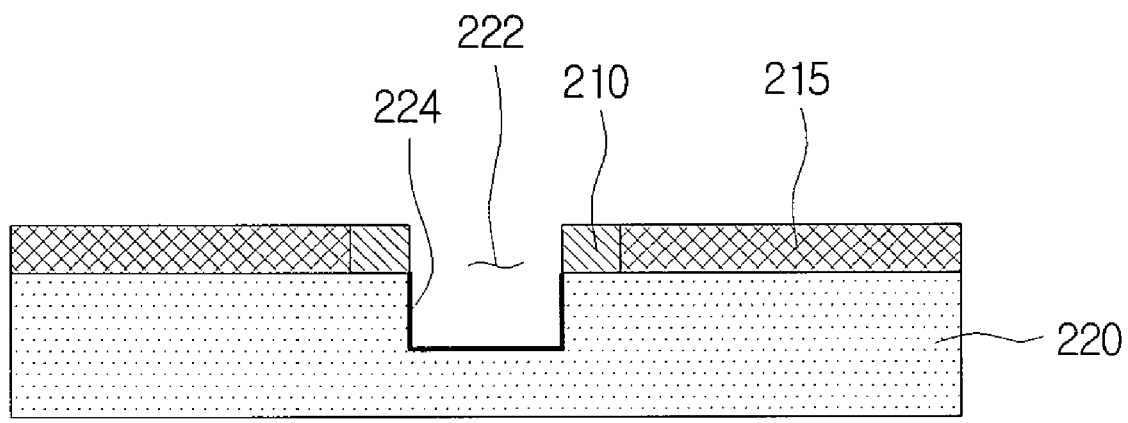

In accordance with the fourth embodiment based on another aspect of the present invention, a semiconductor substrate 220 having one surface on which a conductive pad 210 can be provided, as shown in FIG. 32 (refer to the process represented by S110 in FIG. 3), and a hole 222 can be formed on one surface of the semiconductor substrate 220 to penetrate through the conductive pad 210 and to allow the depth of the hole 222 to be equal to or smaller than the thickness of the semiconductor substrate 220, as shown in FIG. 33 (refer to the process represented by S120 in FIG. 3).

Figure 34:
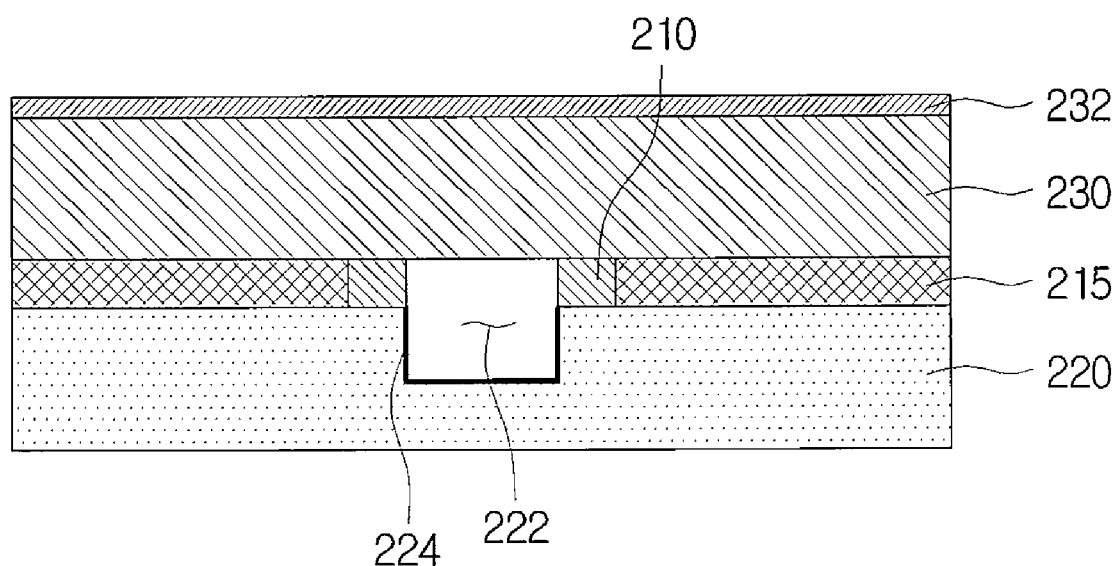
Figure 35:
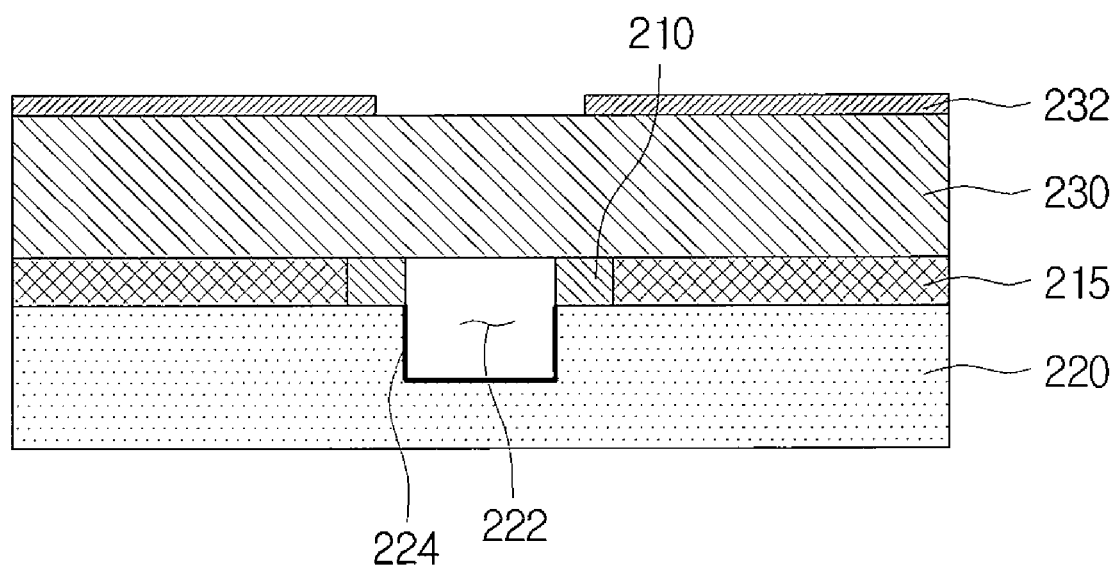
Figure 36:
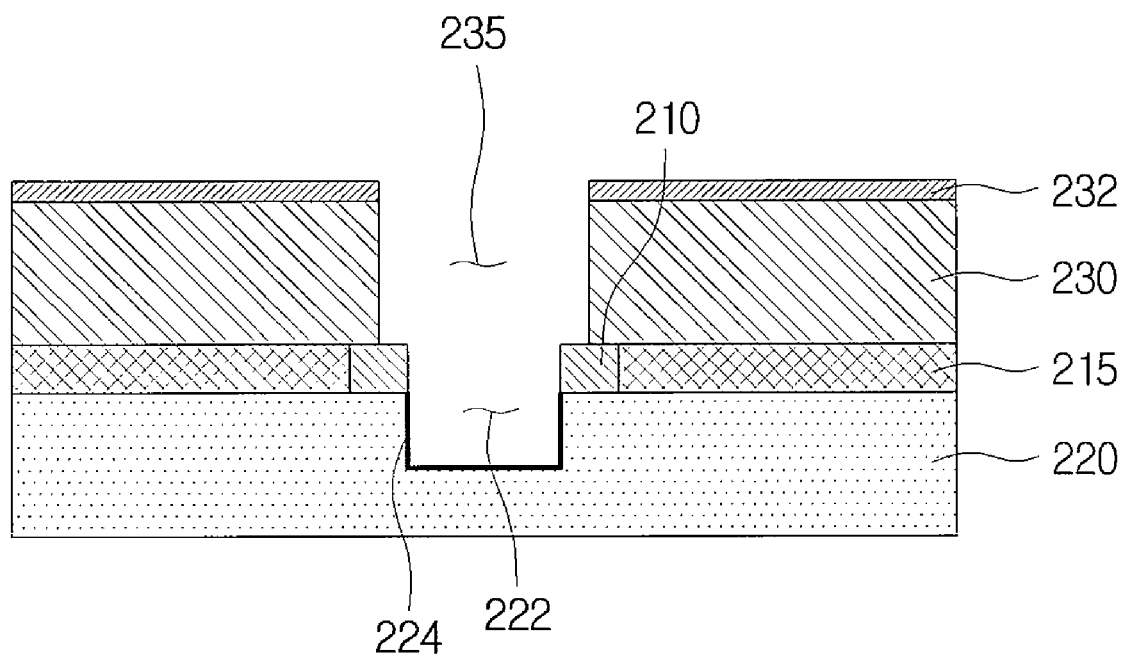
Figure 37:
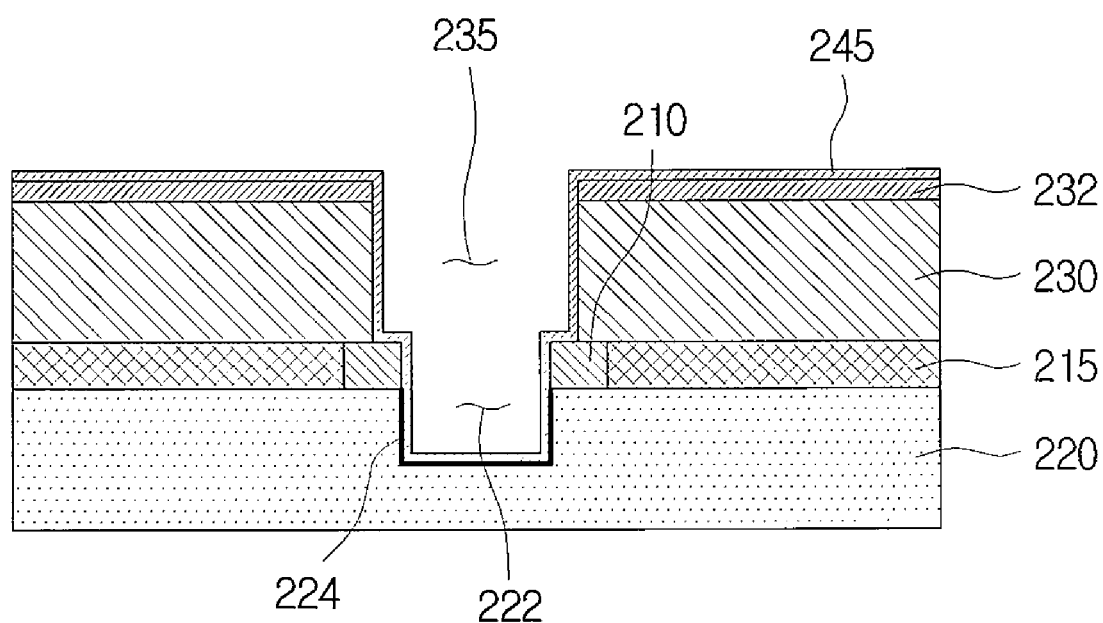
Figure 38:
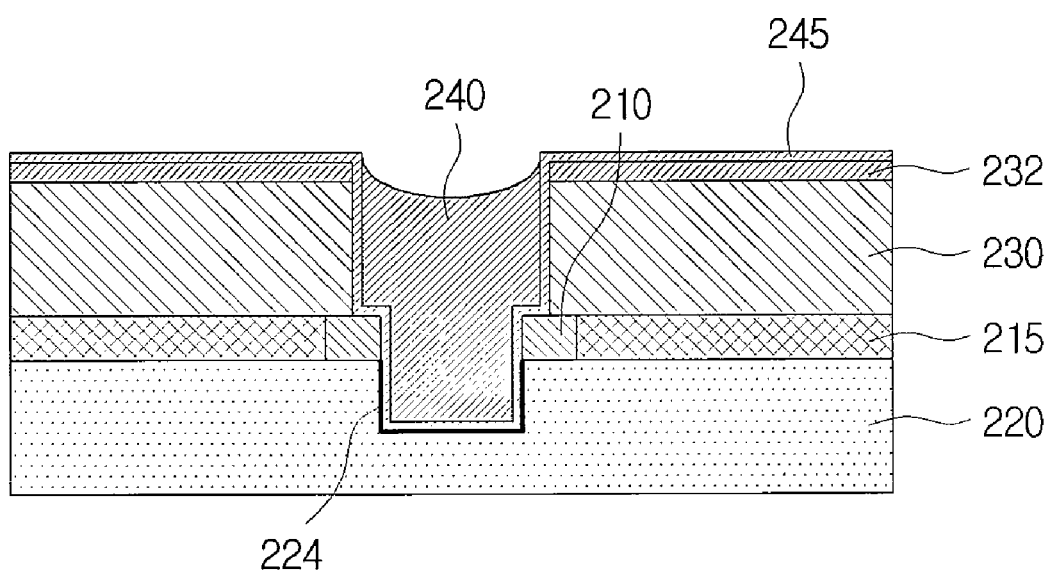

Then, an insulating layer 230 on which an opening 235 is formed corresponding to a position of the conductive pad 210 can be formed on one surface of the semiconductor substrate 220, as shown in FIG. 34 through FIG. 36 (refer to the process represented by S132 in FIG. 3), and a metal post 240 can be formed by filling a conductive material inside the hole 222 and the opening 235, as shown in FIG. 37 and FIG. 38 (refer to the process represented by S134 in FIG. 3).

Figure 39:
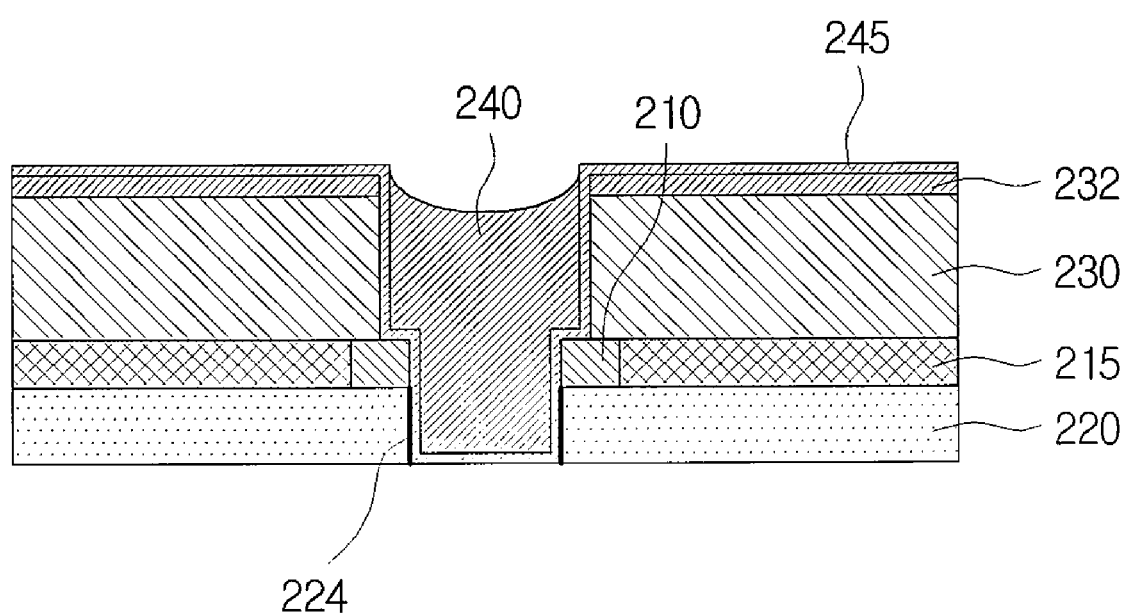
Figure 40:
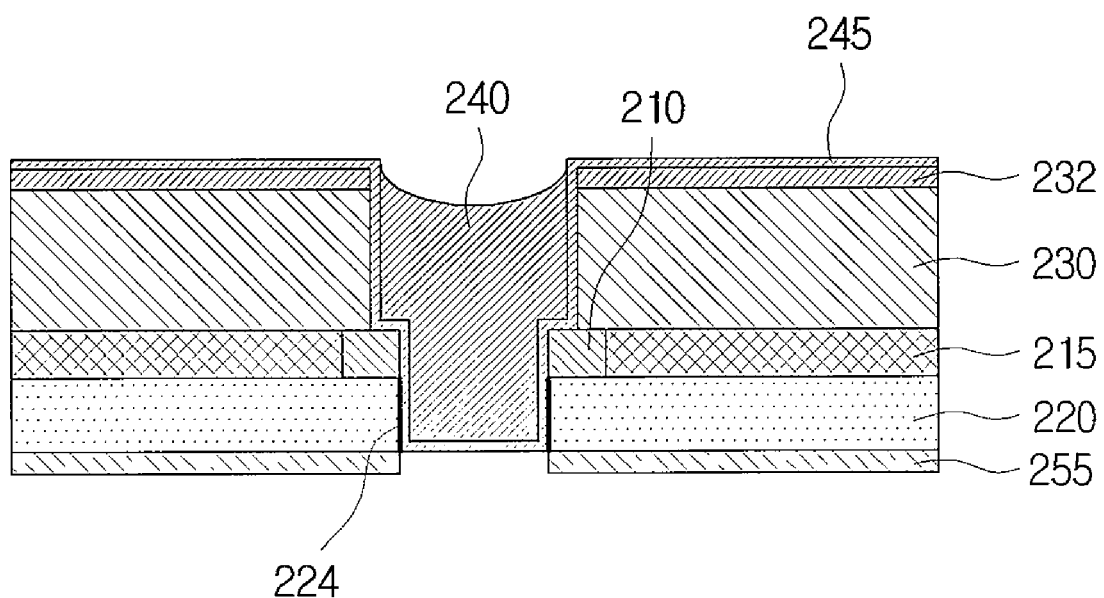
Figure 41:
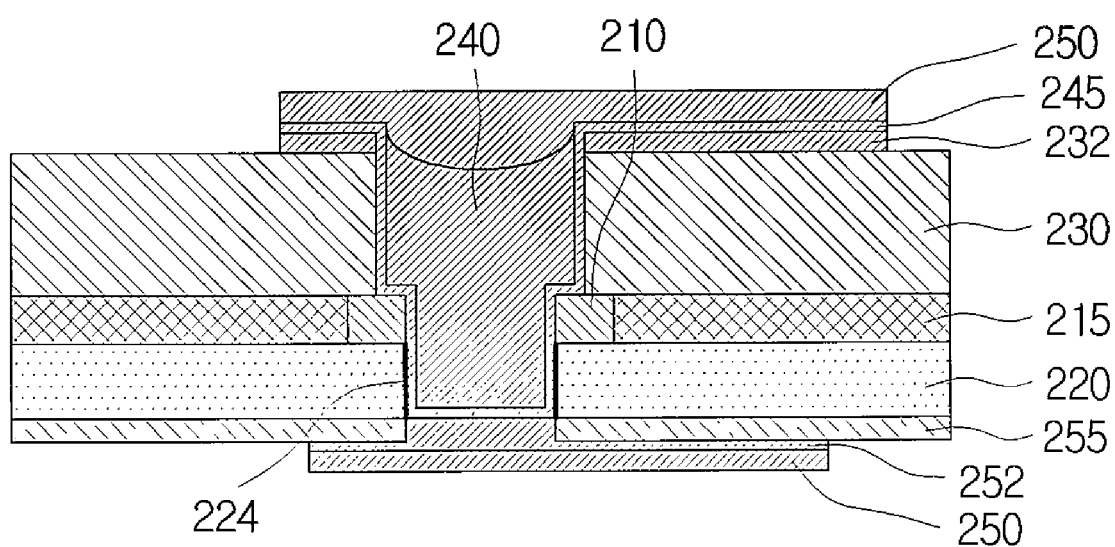
Figure 42:
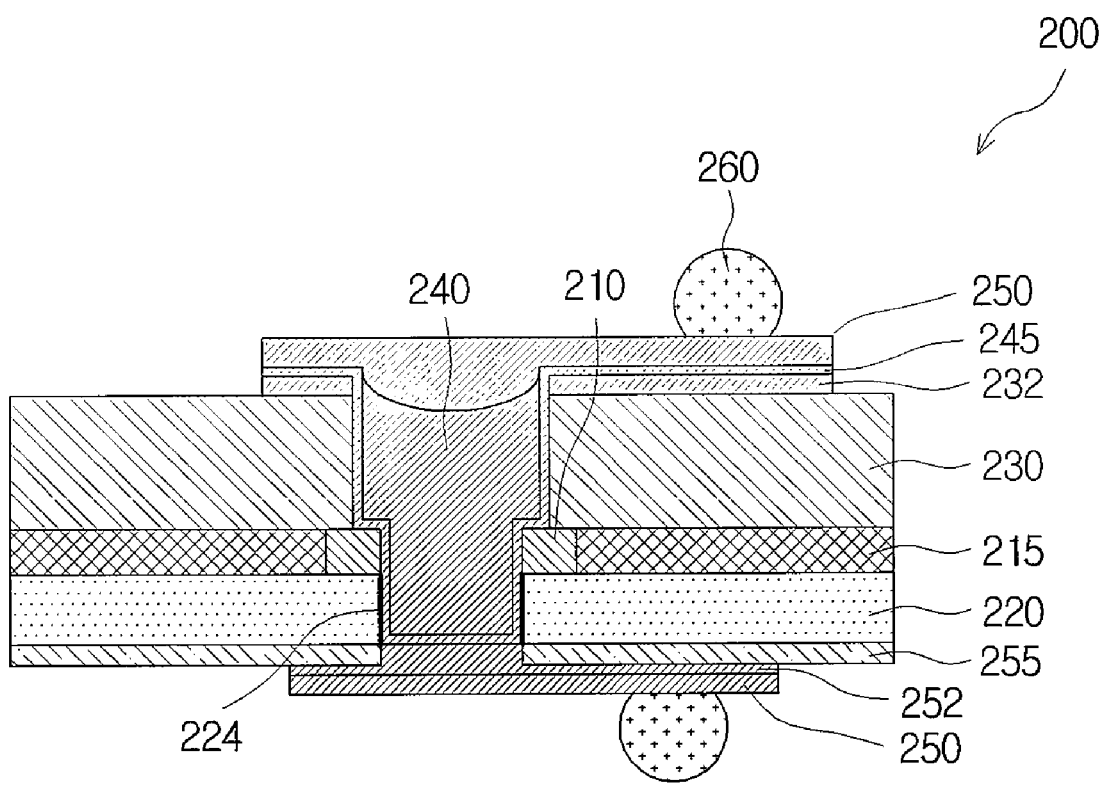

Next, a part of the semiconductor substrate 220 can be removed to expose the metal post 240, as shown in FIG. 39 (refer to the process represented by S140 in FIG. 3). Thereafter, an outer-layer circuit 250 can be formed to be electrically connected to the metal post 240, as shown in FIG. 40 and FIG. 41 (refer to the process represented by S150 in FIG. 3), and a solder bump 260 can be formed on the outer-layer circuit 250, as shown in FIG. 42 (refer to the process represented by S160 in FIG. 3).

In accordance with the fourth embodiment based on another aspect of the present invention, the order and details of processes may be identical or similar to those of the aforementioned embodiment, except that the process of forming the insulating layer 230 (refer to the process represented by S132 in FIG. 3) has a partial modification. Accordingly, the fourth embodiment based on another aspect of the present invention will be described below with reference to FIG. 34 through FIG. 36 on the basis of the process of forming the insulating layer 230 (refer to the process represented by S132 in FIG. 3).

In other words, in accordance with the fourth embodiment based on another aspect of the present invention, the insulating layer 230 on which the opening 235 is formed corresponding to the position of the conductive pad 210 can be formed on one surface of the semiconductor substrate 220, as shown in FIG. 34 through FIG. 36 (refer to the process represented by S132 in FIG. 3). In particular, the insulating layer 230 and a copper foil 232 can be stacked on one surface of the semiconductor substrate 220, as shown in FIG. 35, and a part of the copper foil 232 can be etched and removed corresponding to a position of the conductive pad 210, as shown in FIG. 35. Then, the opening 235 can be formed on the insulating layer 230 by the etching that uses the copper foil 232 as an etching resist, as shown in FIG. 36.

On the other hand, in accordance with the fourth embodiment based on another aspect of the present invention, the copper foil 232 may continuously remain in the processes, and thus the copper foil 232 may remain in the semiconductor package 200.

FIG. 43 through FIG. 54 are cross-sectional views showing each process of a method of manufacturing a semiconductor package 200 in accordance with a fifth embodiment based on another aspect of the present invention.

Figure 43:
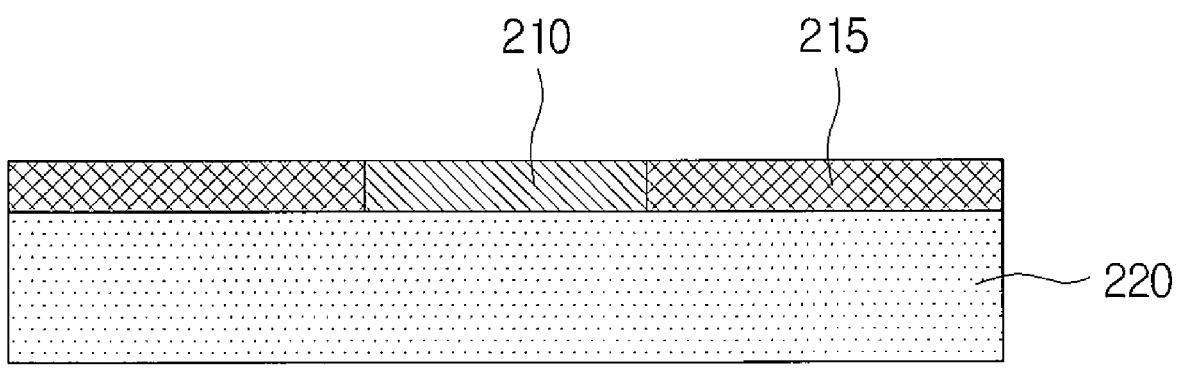
FIG. 43 through FIG. 54 are cross-sectional views showing each process of a semiconductor package manufacturing method in accordance with a fifth embodiment based on another aspect of the present invention.
Figure 44:
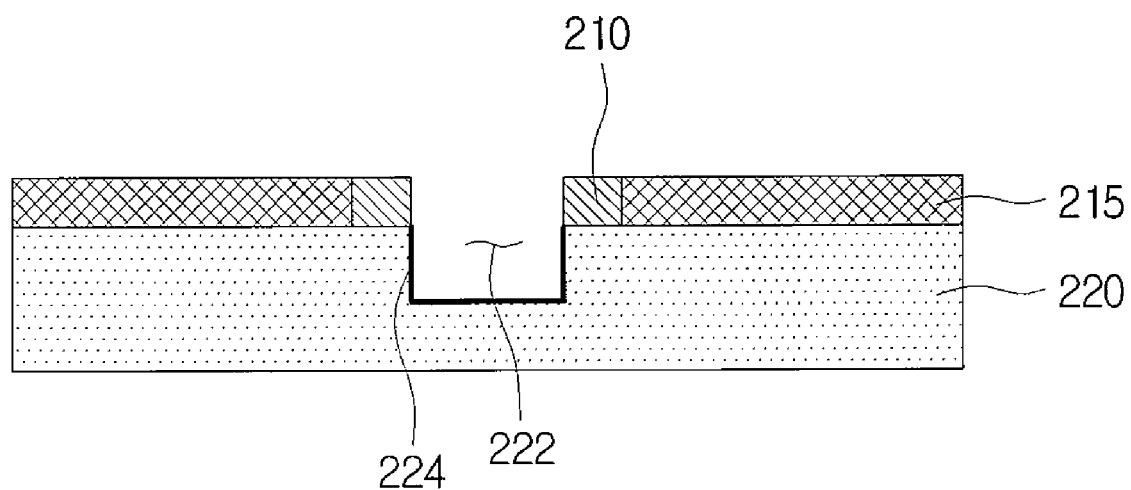

In accordance with the fifth embodiment based on another aspect of the present invention, a semiconductor substrate 220 having one surface on which a conductive pad 210 can be provided, as shown in FIG. 43 (refer to the process represented by S110 in FIG. 3), and a hole 222 can be formed on one surface of the semiconductor substrate 220 to penetrate through the conductive pad 210 and to allow the depth of the hole 222 to be equal to or smaller than the thickness of the semiconductor substrate 220, as shown in FIG. 44 (refer to the process represented by S120 in FIG. 3).

As shown in FIG. 45 through FIG. 49 and FIG. 51, an insulating layer 230 can be formed on one surface of the semiconductor substrate 220 and a metal post 240 can be formed on the hole 222 to allow the metal post 240 to penetrate through the insulating layer 230 (refer to the process represented by S130 in FIG. 3).

Figure 50:
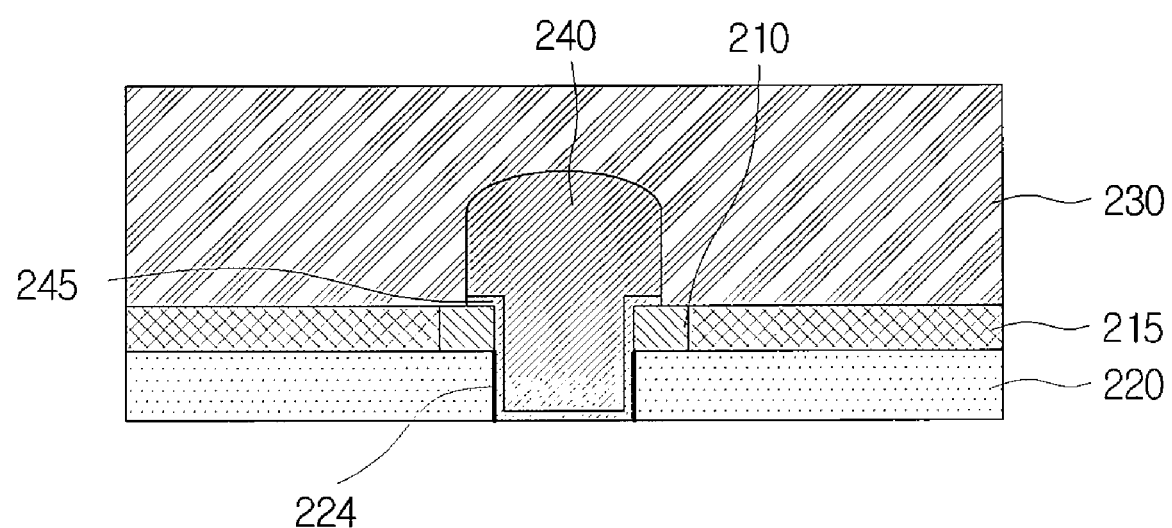
Figure 52:
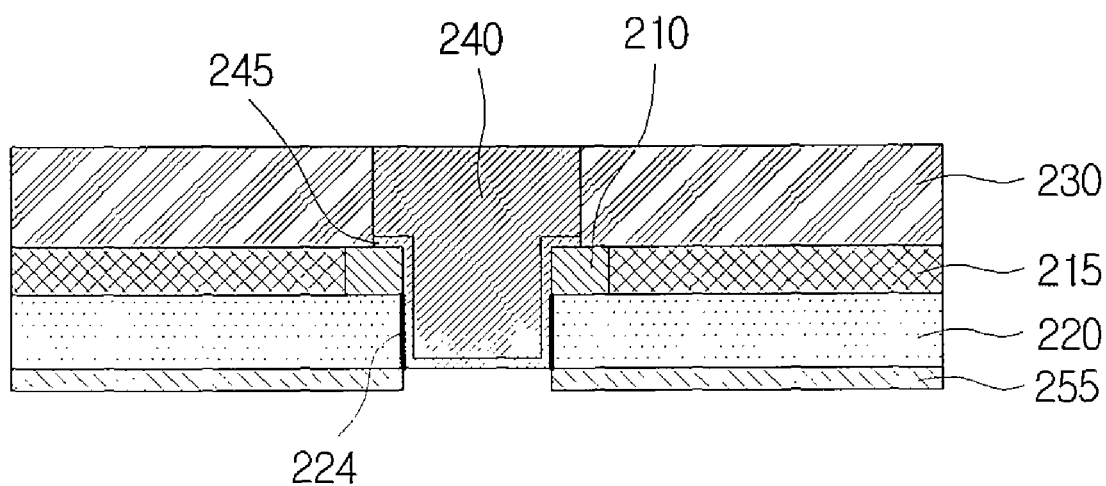
Figure 53:
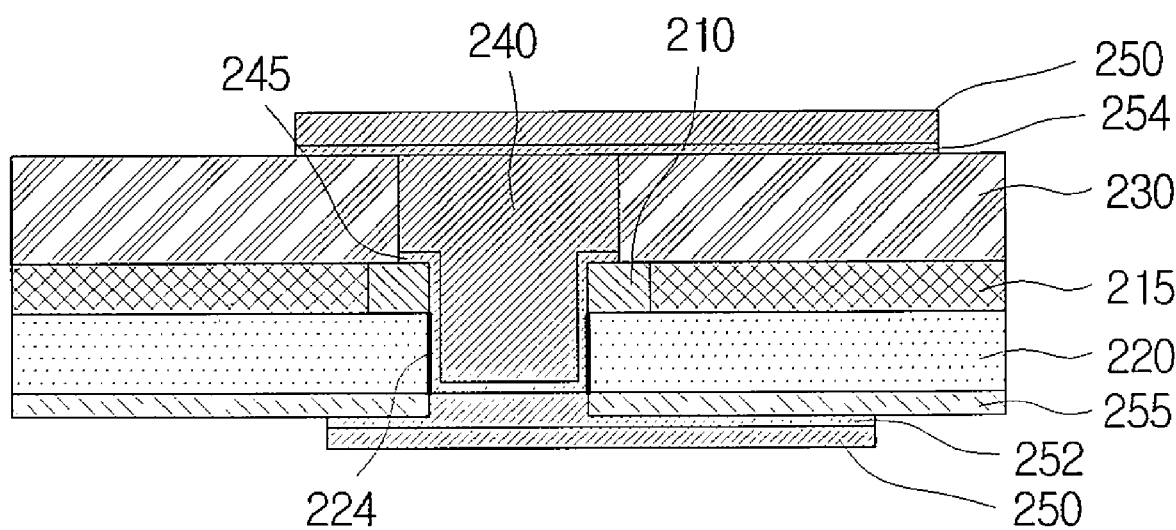
Figure 54:
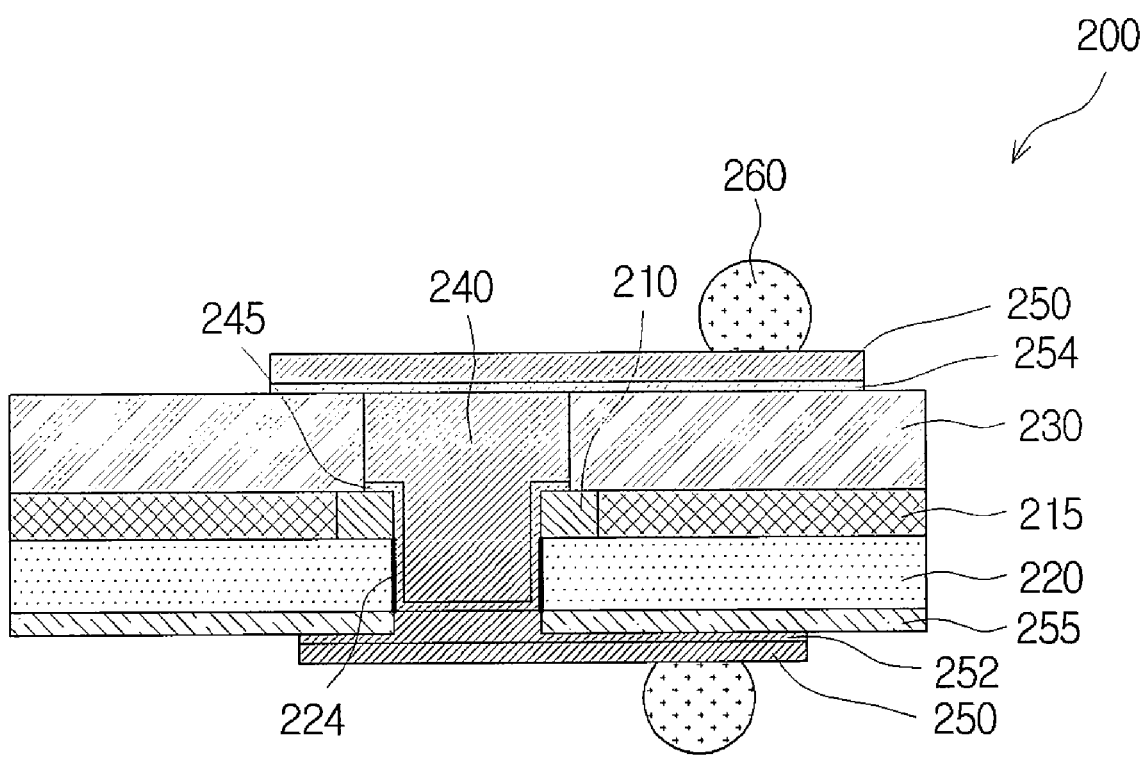

Next, a part of the semiconductor substrate 220 can be removed to expose the metal post 240, as shown in FIG. 50 (refer to the process represented by S140 in FIG. 3). Thereafter, an outer-layer circuit 250 can be formed to be electrically connected to the metal post 240, as shown in FIG. 52 and FIG. 53 (refer to the process represented by S150 in FIG. 3), and a solder bump 260 can be formed on the outer-layer circuit 250, as shown in FIG. 54 (refer to the process represented by S160 in FIG. 3).

In accordance with the fifth embodiment based on another aspect of the present invention, the order and details of processes may be identical or similar to those of the aforementioned embodiment, except that the process of forming the insulating layer 230 and the metal post 240 (refer to the process represented by S130 in FIG. 3) has a partial modification. Accordingly, the fifth embodiment based on another aspect of the present invention will be described below with reference to FIG. 45 through FIG. 51 on the basis of the process of forming the insulating layer 230 and the metal post 240 (refer to the process represented by S130 in FIG. 3).

That is, in accordance with the fifth embodiment based on another aspect of the present invention, an insulating layer 230 can be formed on one surface of the semiconductor substrate 220 and a metal post 240 can be formed on the hole 222 to allow the metal post 240 to penetrate through the insulating layer 230, as shown in FIG. 45 through FIG. 49 and FIG. 51 (refer to the process represented by S130 in FIG. 3). This process, which is to form the metal post 240 first and then form the insulating layer 230, can be divided as follows.

Figure 45:
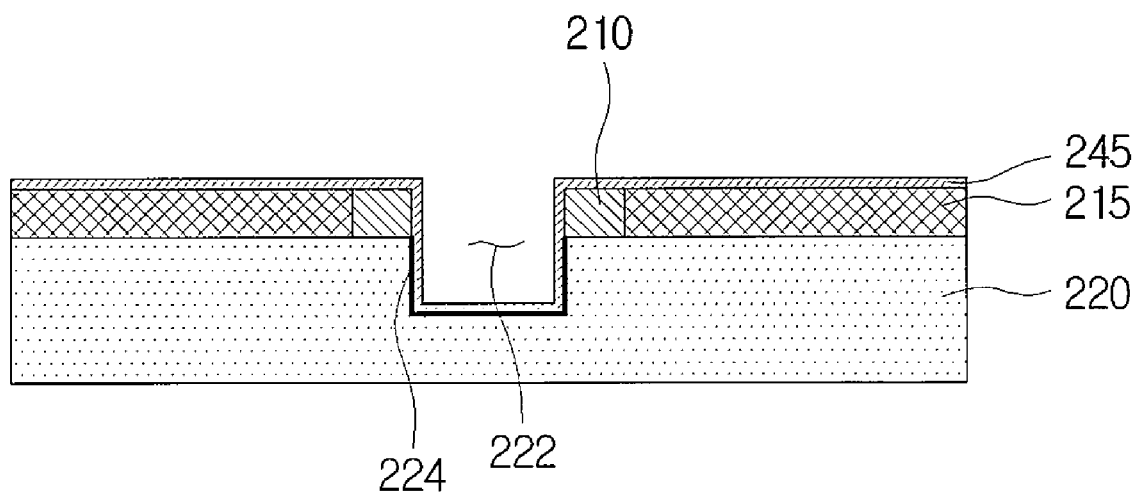
Figure 46:
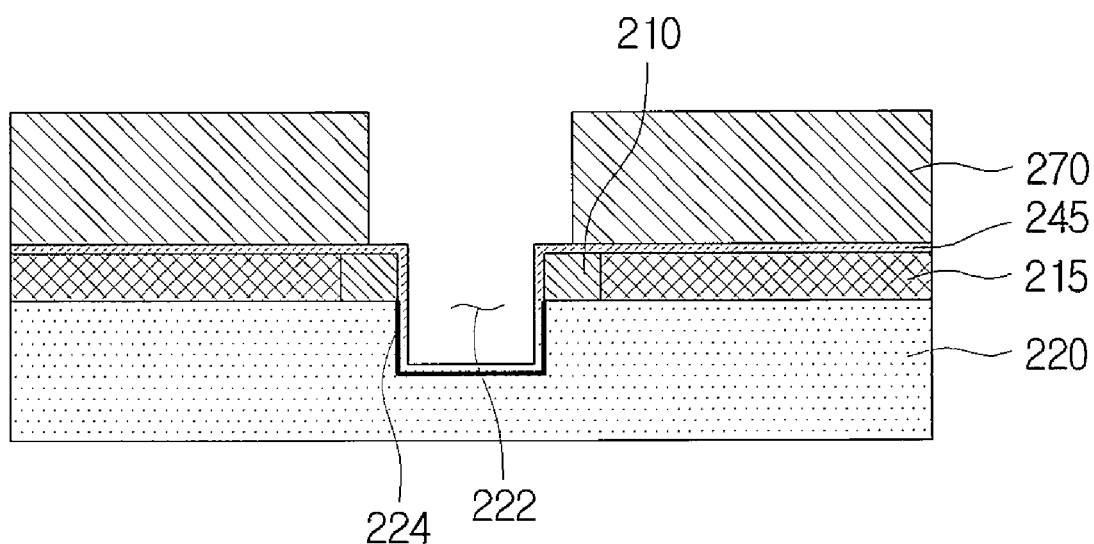

A seed layer 245 can be formed first inside the hole 222 and on the surface of an insulating film 215, as shown in FIG. 45, and a plating resist 270 having an open part that is formed corresponding to a position of the conductive pad 210 can be formed on the seed layer 245. At this time, the plating resist 270 can have an open part by the photo-lithography.

Figure 47:
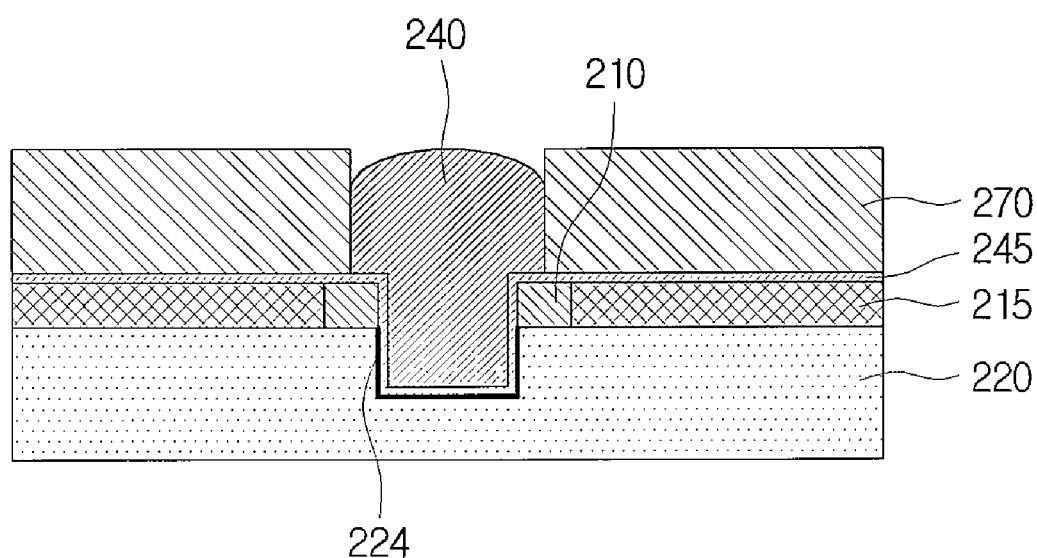
Figure 48:
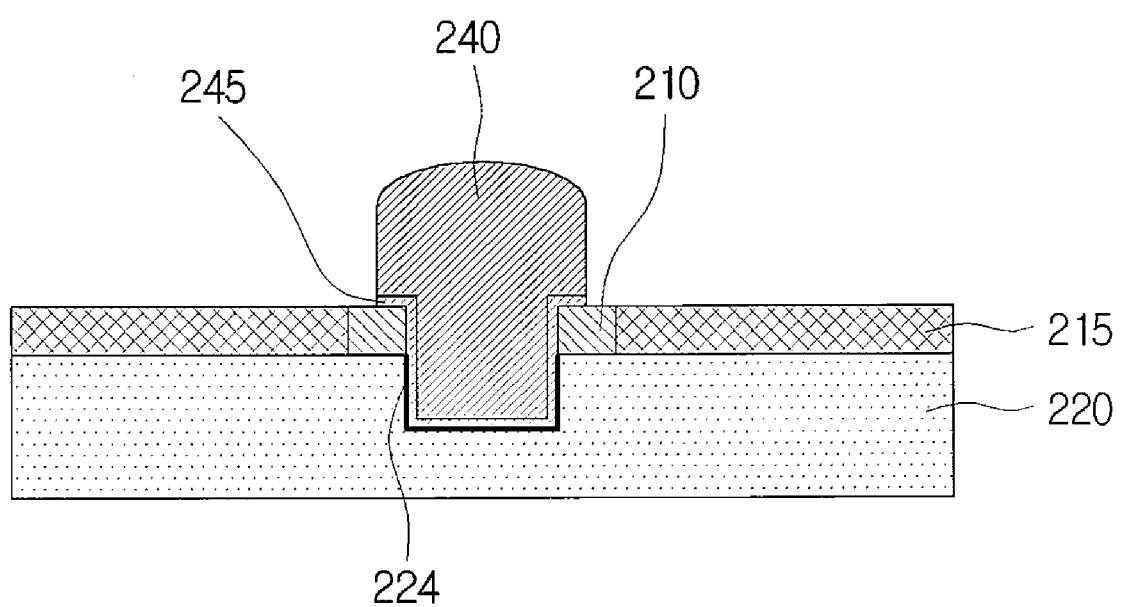

Then, the metal post 240 can be formed by filling a conductive material in the hole 222 and the open part of the plating resist 270, as shown in FIG. 47, and the plating resist 270 and a part of the seed layer 245, on which metal post 240 is not formed, can be removed, as shown in FIG. 48.

Figure 49:
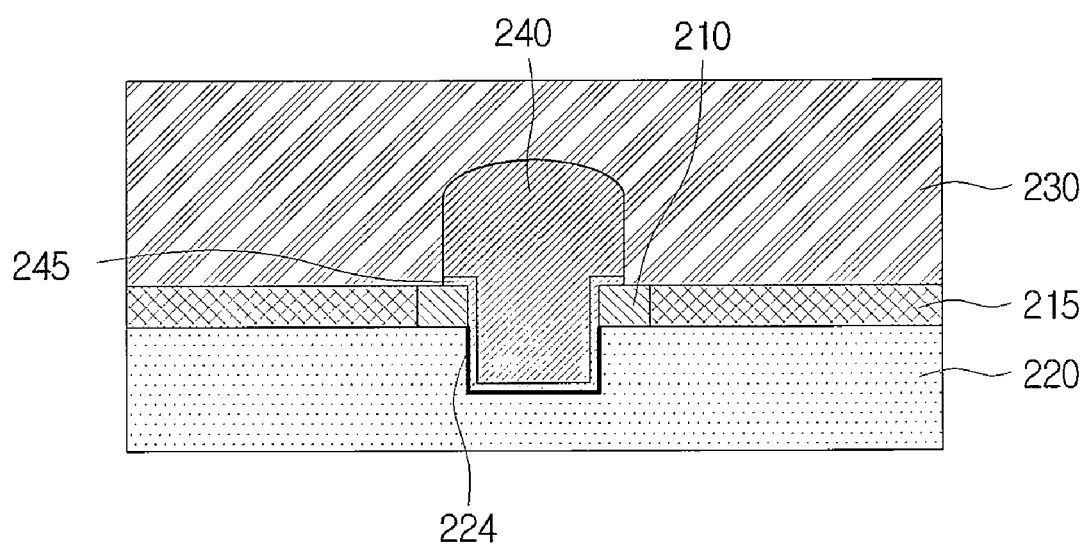
Figure 51:
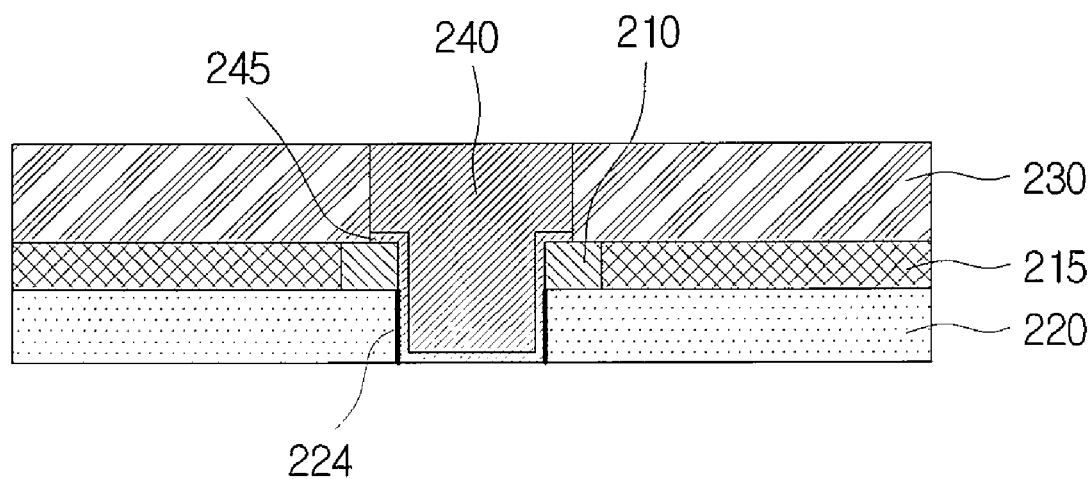

Next, the insulating layer 230 can be formed on one surface of the semiconductor substrate 220 such that the metal post 240 is buried, as shown in FIG. 49. Thereafter, the metal post 240 penetrating through the insulating layer 230 can be formed by removing the surface of the insulating layer 230 and an end part of the metal post 240 through grinding, as shown in FIG. 51.

In accordance with the fifth embodiment based on another aspect of the present invention, the process of removing a part of the semiconductor substrate 220 to expose the metal post 240 (refer to the process represented by S140 in FIG. 3) can be performed by grinding, prior to the process of removing the surface of the insulating layer 230 and an end part of the metal post 240, as shown in FIG. 50, or after the process of removing the surface of the insulating layer 230 and an end part of the metal post 240. This shall be included in the scope of claims of the present invention.

On the other hand, in accordance with the fifth embodiment based on another aspect of the present invention, the metal post 240 can be formed, followed by the insulating layer 230. Accordingly, the seed layer 245 for forming the metal post 240 may not be exposed on the surface of the insulating layer 230, as shown in FIG. 48, and thus the seed layer 252 can be formed on the surface of the insulating layer 230 as well as the surface of the insulating film 255, before the outer-layer circuit 250 is formed, as shown in FIG. 53.

FIG. 55 through FIG. 66 are cross-sectional views showing each process of a method of manufacturing a semiconductor package 200 in accordance with a sixth embodiment based on another aspect of the present invention.

Figure 55:
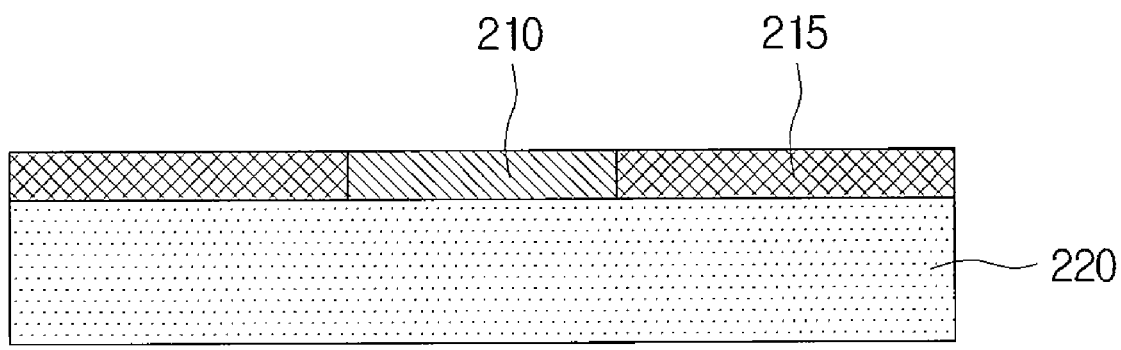
FIG. 55 through FIG. 66 are cross-sectional views showing each process of a semiconductor package manufacturing method in accordance with a sixth embodiment based on another aspect of the present invention.
Figure 56:
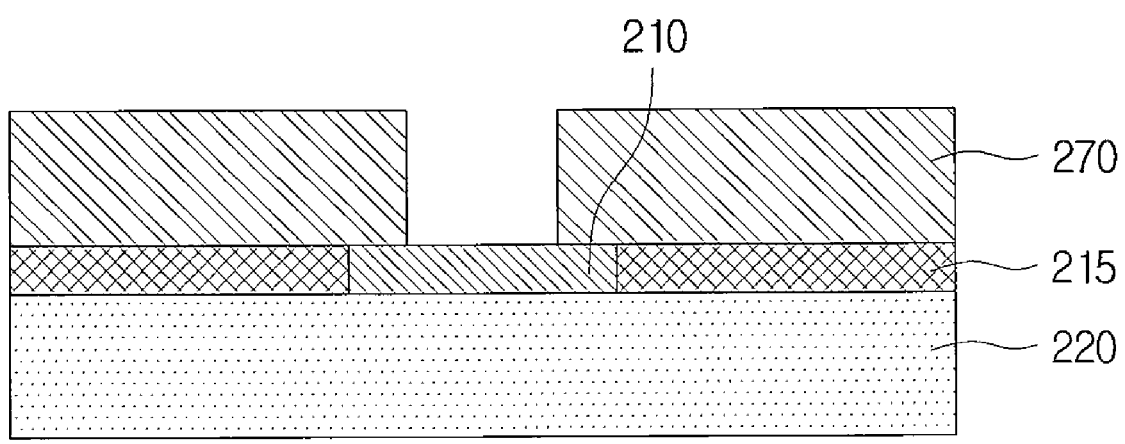
Figure 57:
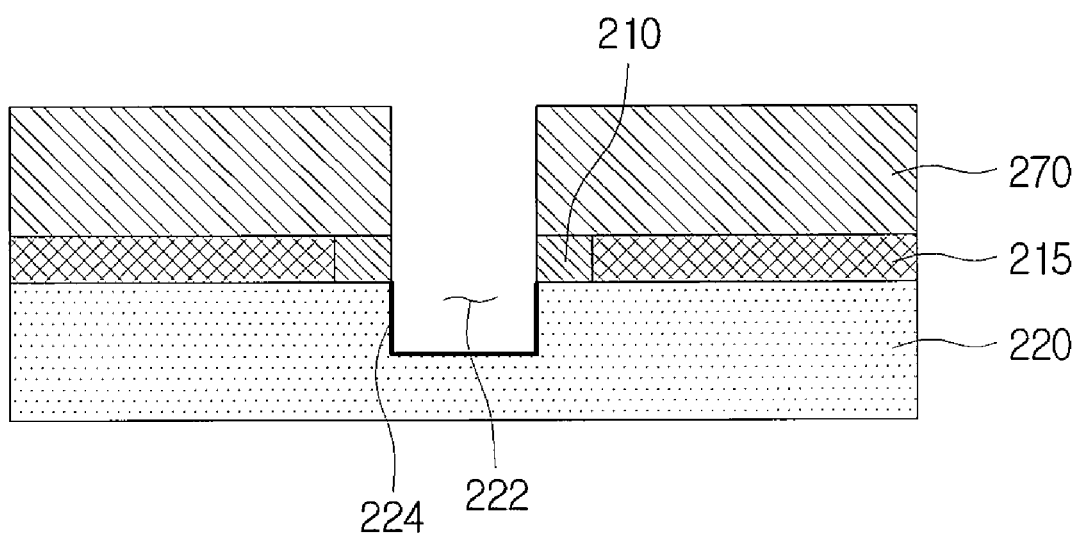

In accordance with the sixth embodiment based on another aspect of the present invention, a semiconductor substrate 220 having one surface on which a conductive pad 210 can be provided, as shown in FIG. 55 (refer to the process represented by S110 in FIG. 3), and a hole 222 can be formed on one surface of the semiconductor substrate 220 to penetrate through the conductive pad 210 and to allow the depth of the hole 222 to be equal to or smaller than the thickness of the semiconductor substrate 220, as shown in FIG. 56 and FIG. 57 (refer to the process represented by S120 in FIG. 3).

As shown in FIG. 58 through FIG. 61 and FIG. 63, an insulating layer 230 can be formed on one surface of the semiconductor substrate 220 and a metal post 240 can be formed on the hole 222 to allow the metal post 240 to penetrate through the insulating layer 230 (refer to the process represented by S130 in FIG. 3).

Figure 62:
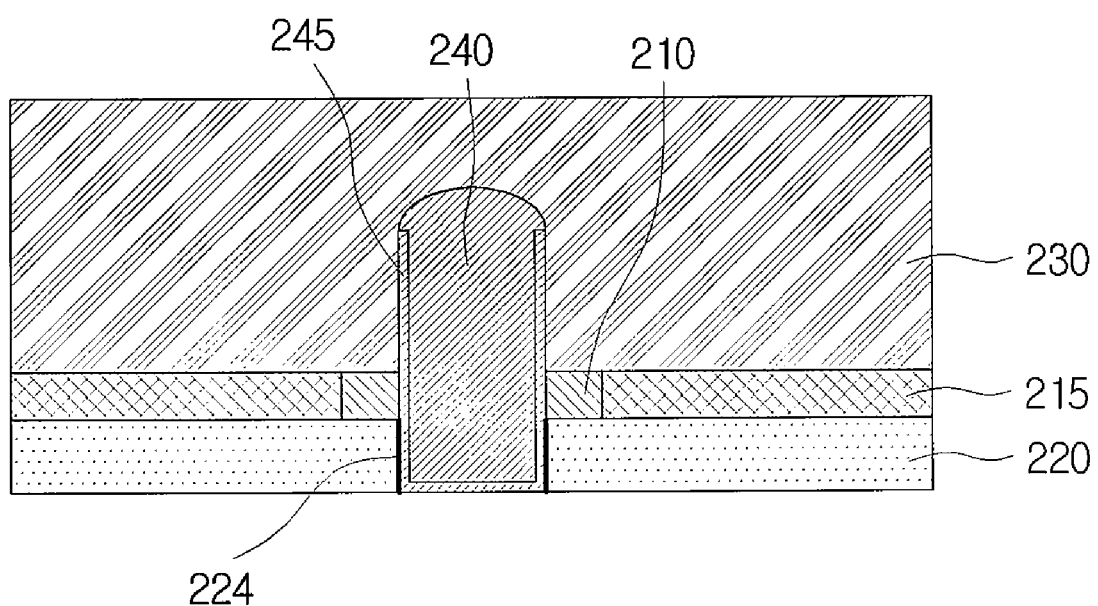
Figure 64:
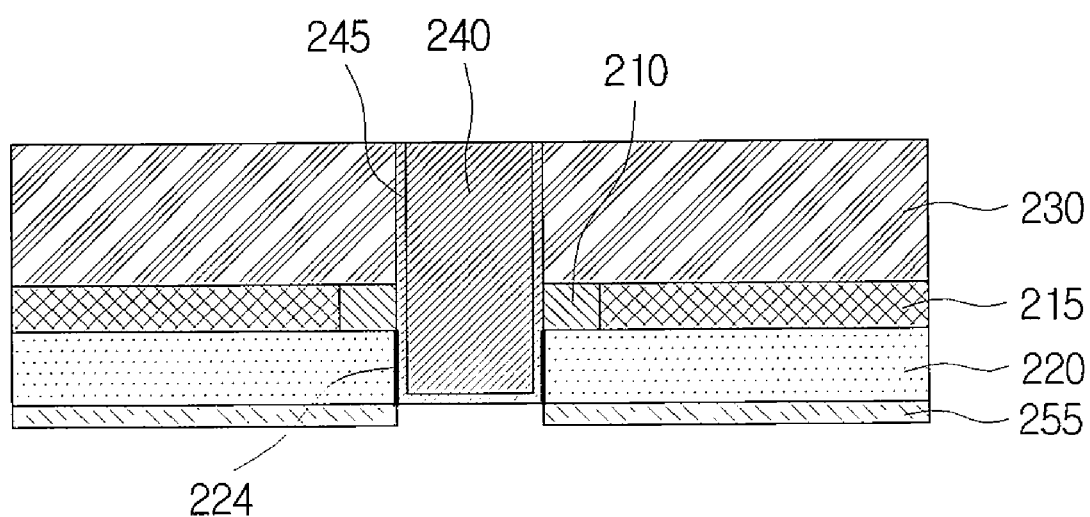
Figure 65:
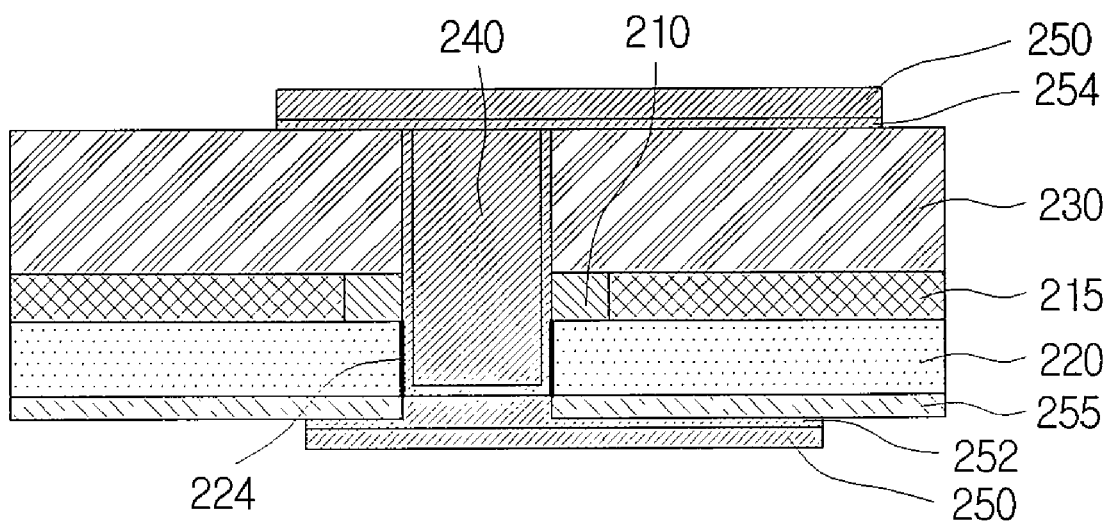
Figure 66:
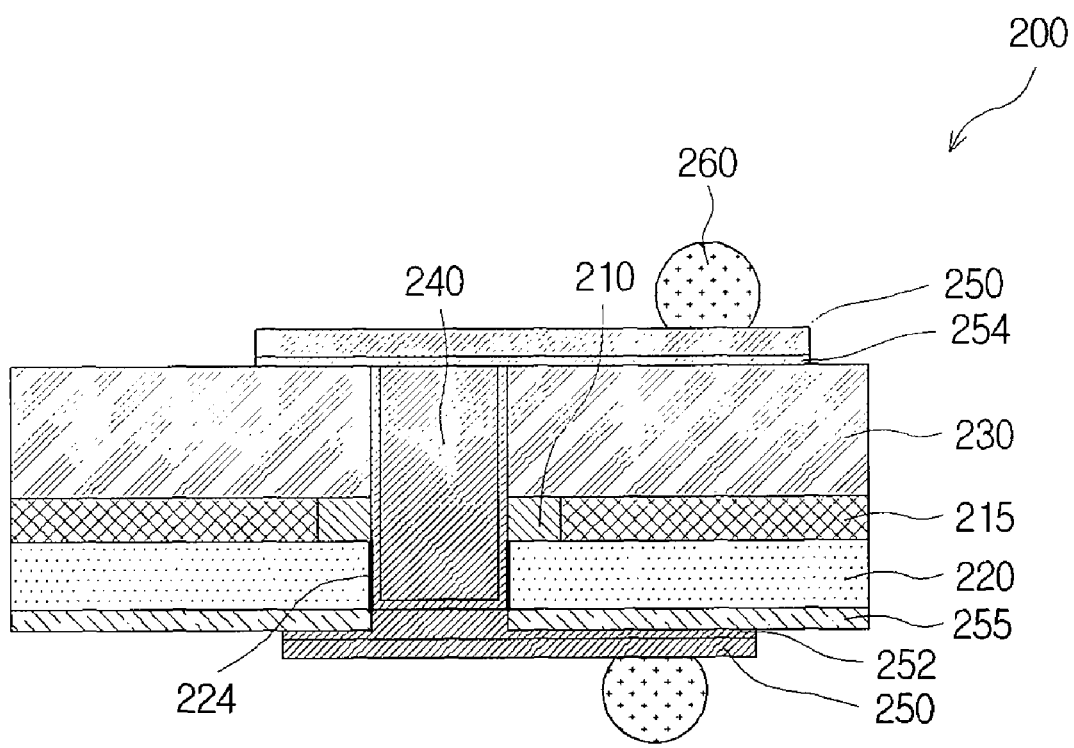

Next, a part of the semiconductor substrate 220 can be removed to expose the metal post 240, as shown in FIG. 62 (refer to the process represented by S140 in FIG. 3). Thereafter, an outer-layer circuit 250 can be formed to be electrically connected to the metal post 240, as shown in FIG. 64 and FIG. 65 (refer to the process represented by S150 in FIG. 3), and a solder bump 260 can be formed on the outer-layer circuit 250, as shown in FIG. 66 (refer to the process represented by S160 in FIG. 3).

In accordance with the sixth embodiment based on another aspect of the present invention, the order and details of processes may be identical or similar to those of the aforementioned embodiment, except that the process of forming the insulating layer 230 and the metal post 240 (refer to the process represented by S130 in FIG. 3) has a partial modification. Accordingly, the sixth embodiment based on another aspect of the present invention will be described below with reference to FIG. 56 through FIG. 63 on the basis of the two processes (refer to the processes represented by S120 and S130 in FIG. 3).

Firstly, the hole 222 can be formed on one surface of the semiconductor substrate 220 to penetrate through the conductive pad 210 and to allow the depth of the hole 222 to be equal to or smaller than the thickness of the semiconductor substrate 220, as shown in FIG. 56 and FIG. 57 (refer to the process represented by S120 in FIG. 3). In particular, a plating resist to be used later for forming the metal post 240 can be formed, as shown in FIG. 56, and then an open part of the plating resist 270 can be formed corresponding to a position of the conductive pad 210.

Then, the hole 222 can be formed to penetrate through the conductive pad 210 of the semiconductor substrate 220 by using the plating resist 270 as an etching resist. At this time, the depth of the hole 222 may be equal to or smaller than the thickness of the semiconductor substrate 220, and the diameter of the hole may be identical or similar to that of the open part of the plating resist 270.

Next, the insulating layer 230 can be formed on one surface of the semiconductor substrate 220 and a metal post 240 can be formed on the hole 222 to allow the metal post 240 to penetrate through the insulating layer 230, as shown in FIG. 58 through FIG. 61 and FIG. 63 (refer to the process represented by S130 in FIG. 3). This process, which is to form the metal post 240 first and then form the insulating layer 230, can be divided as follows.

Figure 58:
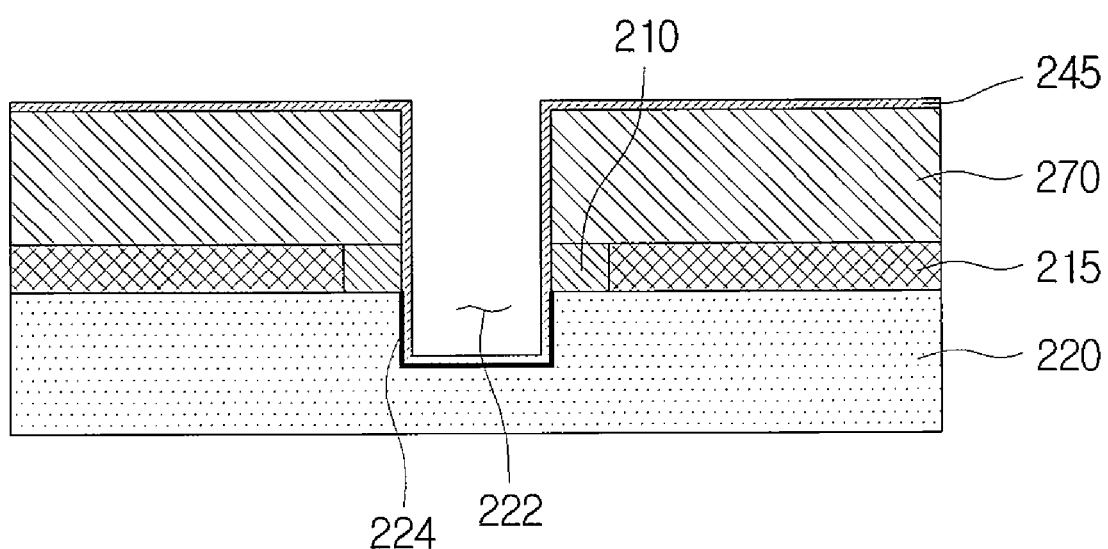
Figure 59:
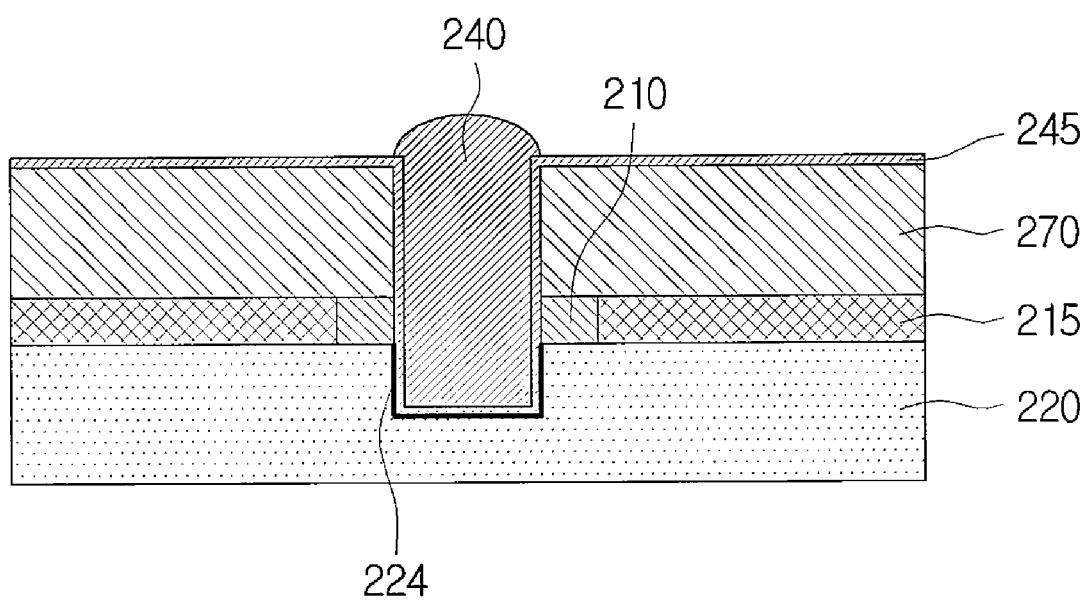
Figure 60:
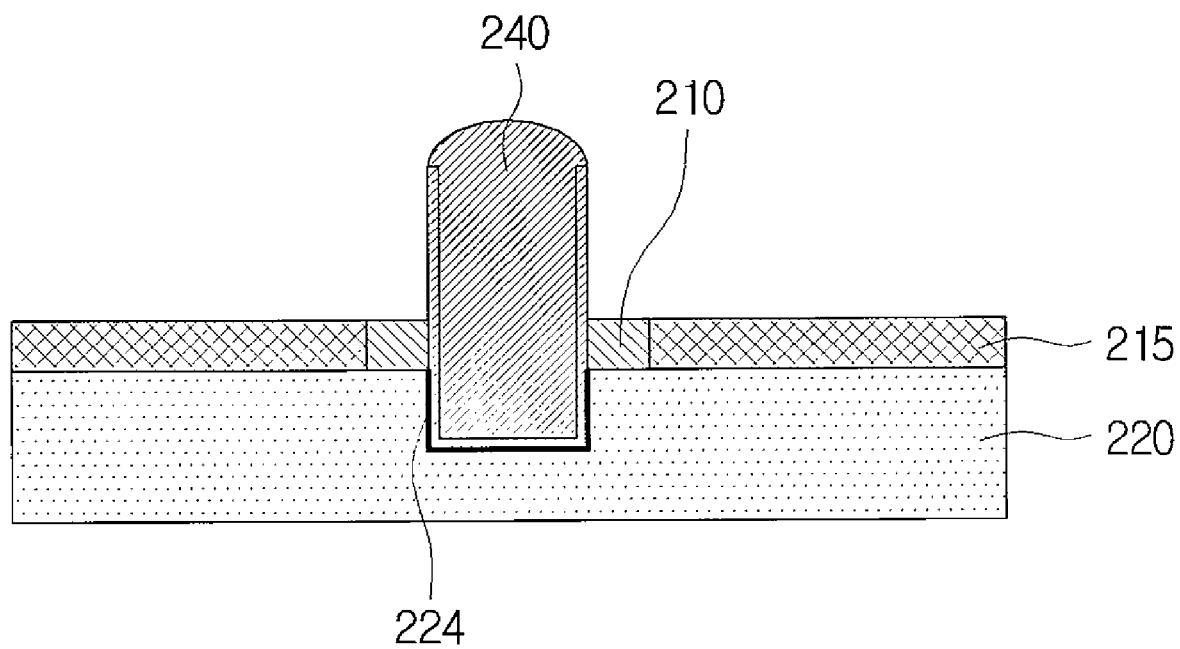

A seed layer 245 can be formed first in the hole 222 and the open part and the surface of the plating resist 270, as shown in FIG. 58, and then the metal post 240 can be formed by filling the conductive material in the hole 222 and the open part of the plating resist 270 by electroplating, as shown in FIG. 59. Then, the plating resist 270 and a part of the seed layer 245, on which metal post 240 is not formed, can be removed, as shown in FIG. 60.

Figure 61:
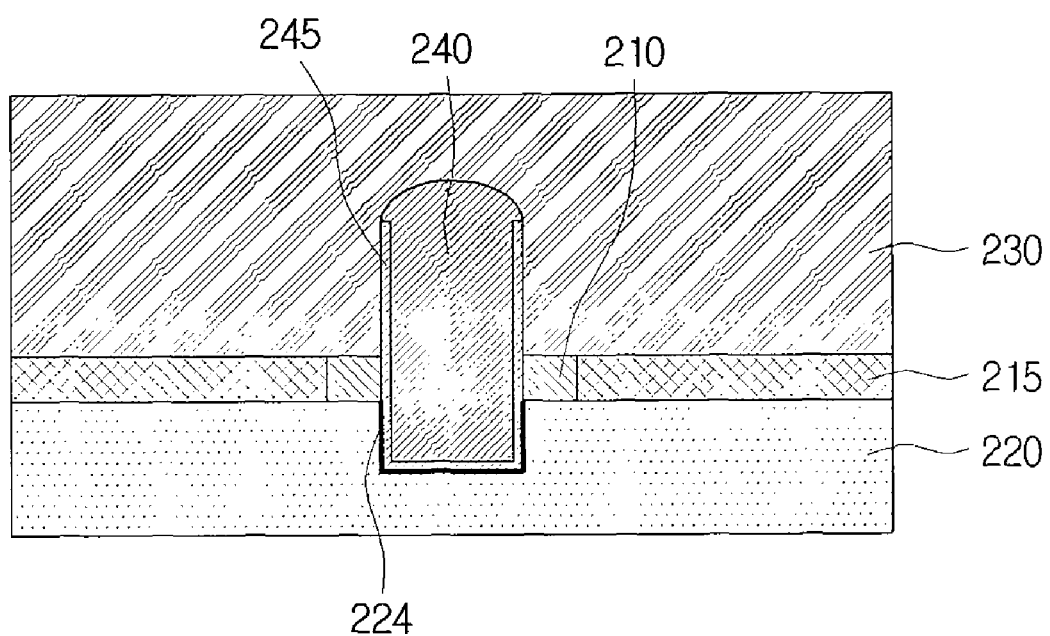
Figure 63:
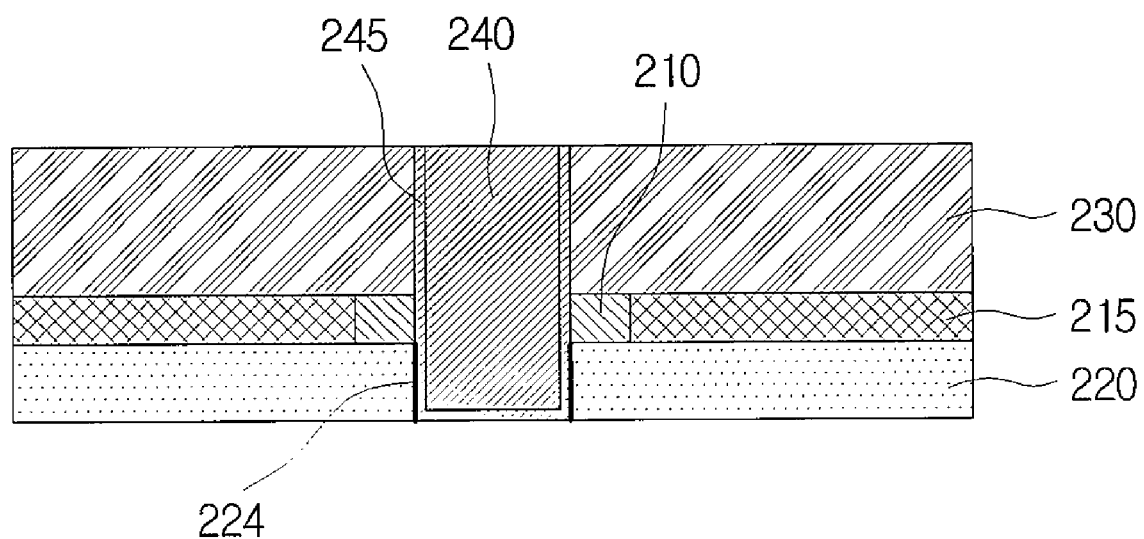

Next, the insulating layer 230 can be formed on one surface of the semiconductor substrate 220 such that the metal post 240 is buried, as shown in FIG. 61. Thereafter, the metal post 240 penetrating through the insulating layer 230 can be formed by removing the surface of the insulating layer 230 and the end part of the metal post 240 through grinding, as shown in FIG. 63.

In accordance with the sixth embodiment based on another aspect of the present invention, the process of removing a part of the semiconductor substrate 220 to expose the metal post 240 (refer to the process represented by S140 in FIG. 3) can be performed by grinding, prior to the process of removing the surface of the insulating layer 230 and an end part of the metal post 240, as shown in FIG. 62, or after the process of removing the surface of the insulating layer 230 and an end part of the metal post 240. This shall be included in the scope of claims of the present invention.

On the other hand, in accordance with the sixth embodiment based on another aspect of the present invention, the metal post 240 can be formed, followed by the insulating layer 230. Accordingly, the seed layer 245 for forming the metal post 240 may not be exposed on the surface of the insulating layer 230, as shown in FIG. 60, and thus the seed layer 252 can be formed on the surface of the insulating layer 230 as well as the surface of the insulating film 255, before the outer-layer circuit 250 is formed, as shown in FIG. 65.

Hitherto, although some embodiments of the present invention have been shown and described, it shall be appreciated by any person of ordinary skill in the art that a large number of modifications, permutations and additions are possible within the principles and spirit of the invention, the scope of which shall be defined by the appended claims and their equivalents.

What is claimed is:

1. A semiconductor package comprising:
 a semiconductor substrate, of which one surface is formed with a conductive pad;
 an insulating layer formed on the one surface of the semiconductor substrate;
 a metal post penetrating through the conductive pad, the semiconductor substrate and the insulating layer;
 a seed layer disposed between the conductive pad and the metal post;
 outer-layer circuits formed on another surface of the semiconductor substrate and an outer surface of the insulating layer, respectively, the outer-layer circuits being electrically connected to the metal post; and
 solder bumps formed on the outer-layer circuits, respectively, wherein:
 the seed layer is in direct contact with the conductive pad, and
 a side surface of the metal post is in direct contact with the seed layer such that the metal post is electrically connected to the conductive pad.

* * * * *